(12) United States Patent
Akutagawa et al.

(10) Patent No.: US 11,230,669 B2
(45) Date of Patent: Jan. 25, 2022

(54) LIQUID CRYSTAL FILM, OPTICAL LAMINATE, CIRCULARLY POLARIZING PLATE, AND ORGANIC ELECTROLUMINESCENT DISPLAY DEVICE

(71) Applicant: FUJIFILM Corporation, Tokyo (JP)

(72) Inventors: Nobuyuki Akutagawa, Kanagawa (JP); Keisuke Yoshimasa, Kanagawa (JP); Akio Tamura, Kanagawa (JP); Reiko Inushima, Kanagawa (JP); Tetsu Kitamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 143 days.

(21) Appl. No.: 16/707,194

(22) Filed: Dec. 9, 2019

(65) Prior Publication Data

US 2020/0109333 A1    Apr. 9, 2020

Related U.S. Application Data

(63) Continuation of application No. PCT/JP2018/025097, filed on Jul. 2, 2018.

(30) Foreign Application Priority Data

Jul. 3, 2017    (JP) ............................. JP2017-130372
Jun. 12, 2018    (JP) ............................. JP2018-111746

(51) Int. Cl.
  *G02F 1/1333*    (2006.01)
  *C09K 19/34*    (2006.01)
  *C09K 19/20*    (2006.01)
  *C09K 19/30*    (2006.01)
  *C09K 19/38*    (2006.01)

(52) U.S. Cl.
  CPC ...... *C09K 19/3497* (2013.01); *C09K 19/2007* (2013.01); *C09K 19/3068* (2013.01); *C09K 19/3823* (2013.01); *C09K 2019/2035* (2013.01); *C09K 2019/3075* (2013.01)

(58) Field of Classification Search
  CPC ............ C09K 19/3497; C09K 19/2007; C09K 19/3068; C09K 19/3823; C09K 19/3491; C09K 19/56; C09K 2019/2035; C09K 2019/3075; C09K 2019/0448; G02F 1/1335; G02F 1/1333
  See application file for complete search history.

(56) References Cited

U.S. PATENT DOCUMENTS

| | | | |
|---|---|---|---|
| 7,462,382 B2 * | 12/2008 | Ito ....................... | G02B 5/3016 428/1.33 |
| 8,153,246 B2 | 4/2012 | Yoshizawa | |
| 2005/0053330 A1 | 3/2005 | Arakida et al. | |
| 2008/0206493 A1 | 8/2008 | Shimoda et al. | |
| 2009/0086130 A1 | 4/2009 | Oikawa et al. | |
| 2009/0273740 A1 | 11/2009 | Yoshizawa | |
| 2013/0265529 A1 | 10/2013 | Wakizaka et al. | |
| 2014/0375935 A1 | 12/2014 | Kamada et al. | |
| 2019/0218460 A1 | 7/2019 | Suzuki et al. | |

FOREIGN PATENT DOCUMENTS

| | | |
|---|---|---|
| CN | 101317110 A | 12/2008 |
| CN | 101324679 A | 12/2008 |
| CN | 101393395 A | 3/2009 |
| JP | 2004-198511 A | 7/2004 |
| JP | 2005-084227 A | 3/2005 |
| JP | 2005-084277 A | 3/2005 |
| JP | 2013-231955 A | 11/2013 |
| WO | 2013/137464 A1 | 9/2013 |
| WO | 2018/062068 A | 4/2018 |

OTHER PUBLICATIONS

International Search Report issued in PCT/JP2018/025097 dated Sep. 25, 2018.
Written Opinion issued in PCT/JP2018/025097 dated Sep. 25, 2018.
International Preliminary Report on Patentability completed by WIPO dated Jan. 7, 2020 in connection with International Patent Application No. PCT/JP2018/025097.
Office Action issued by the State Intellectual Property Office of People's Republic of China dated May 8, 2021, in connection with Chinese Patent Application No. 201880043015.2.
Office Action, issued by the Japanese Patent Office dated Oct. 13, 2020, in connection with Japanese Patent Application No. 2019-527704.
Office Action issued by the Korean Intellectual Property Office dated Nov. 12, 2020, in connection with Korean Patent Application No. 10-2019-7035805.

* cited by examiner

*Primary Examiner* — Geraldina Visconti

(74) *Attorney, Agent, or Firm* — Edwards Neils LLC; Jean C. Edwards, Esq.

(57) ABSTRACT

The present invention provides a liquid crystal film having an optically anisotropic layer having excellent alignment and excellent adhesiveness. The present invention further provides an optical laminate, a circularly polarizing plate, and an organic EL display device, each of which uses the optically anisotropic layer. The liquid crystal film of an embodiment of the present invention is a liquid crystal film having at least an optically anisotropic layer formed with a liquid crystal composition including a polymerizable liquid crystal compound and a fluoroaliphatic group-containing copolymer, and a support, in which the fluoroaliphatic group-containing copolymer has a repeating unit derived from a fluoroaliphatic group-containing monomer represented by General Formula (1) and a repeating unit having a polymerizable group polymerizable with the polymerizable liquid crystal compound.

(1)

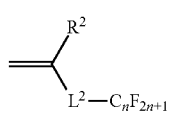

11 Claims, 3 Drawing Sheets

LIQUID CRYSTAL FILM, OPTICAL LAMINATE, CIRCULARLY POLARIZING PLATE, AND ORGANIC ELECTROLUMINESCENT DISPLAY DEVICE

CROSS-REFERENCE TO RELATED APPLICATIONS

This application is a Continuation of PCT International Application No. PCT/JP2018/025097 filed on Jul. 2, 2018, which was published under PCT Article 21(2) in Japanese, and which claims priority under 35 U.S.C. § 119(a) to Japanese Patent Application No. 2017-130372 filed on Jul. 3, 2017 and Japanese Patent Application No. 2018-111746 filed on Jun. 12, 2018. The above applications are hereby expressly incorporated by reference, in their entirety, into the present application.

BACKGROUND OF THE INVENTION

1. Field of the Invention

The present invention relates to a liquid crystal film, an optical laminate, a circularly polarizing plate, and an organic electroluminescent display device.

2. Description of the Related Art

Optical films such as an optical compensation sheet and a phase difference film have been used in various image display devices for the purpose of solving image coloration, widening a viewing angle, and the like.

A stretched birefringent film has been used as the optical film, but it has recently been proposed to use a film (liquid crystal film) having an optically anisotropic layer formed with a liquid crystal compound instead of the stretched birefringent film.

For example, it has been proposed to use an optical film having an optically anisotropic layer containing a predetermined fluoroaliphatic group-containing copolymer in order to display an image having high display quality while not generating unevenness (JP2004-198511A).

On the other hand, advanced functions have recently required for optical films, and in order to satisfy the requirements, it has been proposed to construct various optical laminates by further combining a layer having an optical function with an optically anisotropic layer. In the combination of these layers, it has been proposed to bond the layers to each other through an adhesive layer (WO13/137464A).

SUMMARY OF THE INVENTION

In an optically anisotropic layer formed with a liquid crystal compound, the liquid crystal compound is required to be uniformly aligned so as not to generate alignment defects (satisfying such a requirement will hereinafter be also referred to as having excellent alignment).

On the other hand, the present inventors have found that in a case where an optically anisotropic layer having excellent alignment is formed and an air interface side of such the optically anisotropic layer is adhered to a layer having an optical function (optically functional layer) and the like, adhesion between the optically anisotropic layer and the optically functional layer and the like becomes insufficient in some cases.

Therefore, an object of the present invention is to provide a liquid crystal film having an optically anisotropic layer having excellent alignment and excellent adhesiveness.

In addition, another object of the present invention is to provide an optical laminate, a circularly polarizing plate, and an organic EL display device, each of which uses the optically anisotropic layer.

The present inventors have conducted extensive studies to accomplish the objects, and as a result, they have found that the objects of the present invention are accomplished by forming an optically anisotropic layer with a liquid crystal composition including a polymerizable liquid crystal compound and a predetermined fluoroaliphatic group-containing copolymer.

That is, the present inventors have found that it is possible to accomplish the objects by the following configurations.

[1] A liquid crystal film comprising at least:
an optically anisotropic layer formed with a liquid crystal composition including a polymerizable liquid crystal compound and a fluoroaliphatic group-containing copolymer, and
a support,
in which the fluoroaliphatic group-containing copolymer has a repeating unit derived from a fluoroaliphatic group-containing monomer represented by General Formula (1) which will be described later and a repeating unit having a polymerizable group polymerizable with the polymerizable liquid crystal compound.

[2] The liquid crystal film as described in [1],
in which a content of the fluoroaliphatic group-containing copolymer in the liquid crystal composition is 0.01% to 0.20% by mass with respect to a total mass of the polymerizable liquid crystal compound.

[3] The liquid crystal film as described in [1] or [2],
in which n represents an integer of 4 to 6.

[4] The liquid crystal film as described in any one of [1] to [3],
in which the polymerizable liquid crystal compound has a group selected from the group consisting of groups represented by General Formulae (A1) to (A5) which will be described later.

[5] The liquid crystal film as described in [4],
in which the polymerizable liquid crystal compound is a compound represented by General Formula (W) which will be described later.

[6] The liquid crystal film as described in any one of [1] to [5],
in which the fluoroaliphatic group-containing copolymer further has a repeating unit derived from a terminal cyclic hydrocarbon group-containing monomer.

[7] The liquid crystal film as described in [6],
in which the terminal cyclic hydrocarbon group-containing monomer is a compound represented by General Formula (2) which will be described later.

[8] The liquid crystal film as described in any one of [1] to [7], further comprising:
a photo-alignment layer between the support and the optically anisotropic layer.

[9] The liquid crystal film as described in any one of [1] to [8],
in which the support is provided to be peelable.

[10] An optical laminate comprising at least:
an optically anisotropic layer formed with a liquid crystal composition including a polymerizable liquid crystal compound and a fluoroaliphatic group-containing copolymer; an adhesive layer; and
an optically functional layer, in which the optically anisotropic layer and the optically functional layer are adhered to each other through the adhesive layer, and the fluoroaliphatic group-containing copolymer has a repeating unit derived from a fluoroaliphatic group-containing monomer represented by General Formula (1) which will be described later and a repeating unit having a polymerizable group polymerizable with the polymerizable liquid crystal compound.

[11] The optical laminate as described in [10],
in which the adhesive layer is a layer formed by curing a photopolymerizable adhesive.

[12] The optical laminate as described in [10] or [11],
in which the optically functional layer is a liquid crystal layer.

[13] The optical laminate as described in any one of [10] to [12], further comprising:
a polarizer.

[14] A circularly polarizing plate comprising the optical laminate as described in any one of [10] to [13].

[15] An organic electroluminescent display device comprising:
an organic electroluminescent display element; and
the circularly polarizing plate as described in [14].

According to the present invention, it is possible to provide a liquid crystal film having an optically anisotropic layer having excellent alignment and excellent adhesiveness.

In addition, it is possible to provide an optical laminate, a circularly polarizing plate, and an organic EL display device, each of which uses the optically anisotropic layer.

DESCRIPTION OF THE PREFERRED EMBODIMENTS

Figure 1:
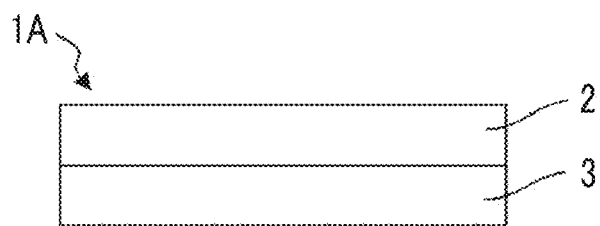
FIG. 1 is a schematic cross-sectional view showing an example of the liquid crystal film of an embodiment of the present invention.

Hereinafter, the present invention will be described in detail.

The following description of the constitutional requirements is made based on representative embodiments of the present invention in some cases, but it should not be construed that the present invention is limited to such embodiments.

Furthermore, in the present specification, a numerical range expressed using "to" means a range that includes the preceding and succeeding numerical values of "to" as the lower limit value and the upper limit value, respectively.

In addition, in the present specification, the bonding direction of a divalent group (for example, —CO—O—) expressed is not particularly limited, and for example, in a case where $D^1$ in General Formula (W) which will be described later is —CO—O—, $D^1$ may be either *1-CO—O-*2 or *1-O—CO-*2, in which *1 represents a position bonding to the Ar side and *2 represents a position bonding to the $G^1$ side.

In the present specification, (meth)acrylate represents acrylate or methacrylate. Further, (meth)acrylic acid represents acrylic acid or methacrylic acid. A (meth)acryloyl group represents a methacryloyl group or an acryloyl group.

In the present specification, the weight-average molecular weight (Mw), the number-average molecular weight (Mn), and the dispersity (also referred to as a molecular weight distribution) (Mw/Mn) of a resin are defined as values in terms of polystyrene by means of gel permeation chromatography (GPC) measurement (solvent: tetrahydrofuran, flow amount (amount of a sample injected): 10 µl, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

In citations for a group (atomic group) in the present specification, in a case where the group is denoted without specifying whether it is substituted or unsubstituted, the group includes both a group not having a substituent and a group having a substituent. For example, an "alkyl group" includes not only an alkyl group not having a substituent (unsubstituted alkyl group), but also an alkyl group having a substituent (substituted alkyl group). In addition, an "organic group" in the present specification refers to a group having at least one carbon atom.

Moreover, in the present specification, the type of the substituent, the position of the substituent, and the number of the substituents in a case of referring to "which may have a substituent" are not particularly limited. The number of the substituents may be, for example, one, two, three, or the like. Examples of the substituent include a monovalent non-metal atomic group excluding a hydrogen atom, and can be selected from, for example, the following substituent group T.

(Substituent T)

Examples of the substituent T include a halogen atom such as a fluorine atom, a chlorine atom, a bromine atom, and an iodine atom; an alkoxy group such as a methoxy group, an ethoxy group, and a tert-butoxy group; an aryloxy group such as a phenoxy group and a p-tolyloxy group; an alkoxycarbonyl group such as a methoxycarbonyl group, a butoxycarbonyl group, and a phenoxycarbonyl group; an acyloxy group such as an acetoxy group, a propionyloxy group, and a benzoyloxy group; an acyl group such as an acetyl group, a benzoyl group, an isobutyryl group, an acryloyl group, a methacryloyl group, and a methoxalyl group; an alkylsulfanyl group such as a methylsulfanyl group and a tert-butylsulfanyl group; an arylsulfanyl group such as a phenylsulfanyl group and a p-tolylsulfanyl group; an alkyl group; a cycloalkyl group; an aryl group; a heteroaryl group; a hydroxyl group; a carboxy group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; and a combination thereof.

[Liquid Crystal Film]

The liquid crystal film of the embodiment of the present invention has at least an optically anisotropic layer formed with a liquid crystal composition, and a support.

In addition, the liquid crystal composition includes a polymerizable liquid crystal compound and a fluoroaliphatic group-containing copolymer.

The fluoroaliphatic group-containing copolymer has a repeating unit derived from a fluoroaliphatic group-containing monomer represented by General Formula (1) which will be described later and a repeating unit having a polymerizable group polymerizable with the polymerizable liquid crystal compound.

A mechanism in that the object of the present invention can be accomplished by allowing the liquid crystal film to take such a configuration is not necessarily clear, but is presumed to be as follows by the present inventors.

Firstly, it is considered that since an additive used for an improvement in the alignment of an optically anisotropic layer in a case where the optically anisotropic layer is formed by application of a liquid crystal composition onto a support, or the like is unevenly distributed on an air interface side of the optically anisotropic layer, a phenomenon that the adhesiveness of the optically anisotropic layer becomes insufficient occurs. The additive which is unevenly distributed is likely to form a fragile layer on the air interface side of the optically anisotropic layer, and as a result, in a case where the surface on the air interface side of the optically anisotropic layer is adhered to the optically functional layer or the like, the optically anisotropic layer, the optically functional layer, and the like are easily peeled in the state where the fragile layer is peeled.

With regard to this problem, in the present invention, a predetermined fluoroaliphatic group-containing copolymer is used in a liquid crystal composition which is used to form an optically anisotropic layer. By incorporating a repeating unit derived from the fluoroaliphatic group-containing monomer represented by General Formula (1) which will be described later into the fluoroaliphatic group-containing copolymer, it is possible to improve the alignment of an optically anisotropic layer thus formed. In addition, the fluoroaliphatic group-containing copolymer has a repeating unit having a polymerizable group, and the fluoroaliphatic group-containing copolymer unevenly distributed on the air interface side of the optically anisotropic layer can be copolymerized with the polymerizable liquid crystal compound, whereby the surface of the optically anisotropic layer can be rigid. As a result, it is considered by the present inventors that the optically anisotropic layer, the optically functional layer, and the like as described above are hardly peeled, and thus, the adhesiveness is improved.

The liquid crystal film of the embodiment of the present invention will be described in detail.

Figure 2:
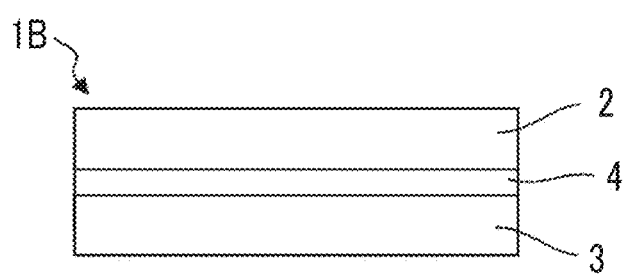
FIG. 2 is a schematic cross-sectional view showing an example of the liquid crystal film of the embodiment of the present invention.
Figure 3:
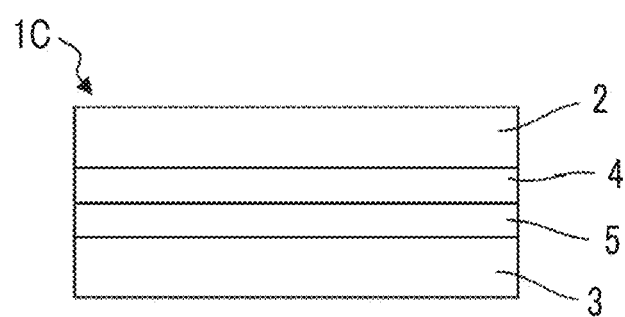
FIG. 3 is a schematic cross-sectional view showing an example of the liquid crystal film of the embodiment of the present invention.

The liquid crystal film of the embodiment of the present invention can be shown in the form of, for example, a schematic cross-sectional view as shown in FIGS. 1 to 3.

FIG. 1 shows a liquid crystal film 1A of the embodiment of the present invention in which an optically anisotropic layer 2 is directly laminated on a support 3.

FIG. 2 shows a film 1B formed by laminating an optically anisotropic layer 2 onto an alignment layer 4 provided on a support 3.

FIG. 3 shows a liquid crystal film 1C in which an intermediate layer 5 is provided between a support 3 and an alignment layer 4.

Hereinafter, each of the layers constituting the liquid crystal film of the embodiment of the present invention will be described.

[Optically Anisotropic Layer]

<Liquid Crystal Composition>

The optically anisotropic layer is formed with a liquid crystal composition (composition for forming an optically anisotropic layer). The liquid crystal composition includes at least a fluoroaliphatic group-containing copolymer and a polymerizable liquid crystal compound.

Hereinafter, the components included in the liquid crystal composition will be described.

(Polymerizable Liquid Crystal Compound)

The liquid crystal composition includes a polymerizable liquid crystal compound.

The polymerizable liquid crystal compound is a liquid crystal compound having at least one or more polymerizable groups.

Generally, the liquid crystal compounds can be classified into a rod-like type and a disk-like type, depending on the shape. In addition, the respective types can further be classified into a low molecular type and a high molecular type. The high molecular type generally refers to a polymer having a degree of polymerization of 100 or more (Kobunshi Butsuri Souten-i Dainamikusu (Polymer Physics and Phase Transition Dynamics), written by Masao Doi, p. 2, Iwanami Shoten, Publishers, 1992).

Any liquid crystal compound can be used as the polymerizable liquid crystal compound as long as it has a polymerizable group, and among those, the rod-like polymerizable liquid crystal compound or the disk-like polymerizable liquid crystal compound is preferably used, and the rod-like polymerizable liquid crystal compound is more preferably used.

In addition, the liquid crystal composition may further include a liquid crystal compound other than the polymerizable liquid crystal compound.

The polymerizable liquid crystal compound preferably has two or more polymerizable groups in one molecule. Further, in a case where two or more polymerizable liquid crystal compounds are used, it is preferable that at least one of the polymerizable liquid crystal compounds has two or more polymerizable groups in one molecule.

In addition, after fixing the liquid crystal compound by the polymerization, it is already not necessary to exhibit the liquid crystallinity, but a layer thus formed is conveniently referred to as a liquid crystal layer in some cases. The liquid crystal layer is preferably a layer in which the aligned liquid crystal compound is fixed while the alignment state is maintained.

The type of the polymerizable group contained in the polymerizable liquid crystal compound is not particularly limited, a functional group capable of performing an addition polymerization reaction is preferable, and an ethylenically unsaturated polymerizable group or a ring polymerizable group is preferable. More specifically, a (meth)acryloyl group, a vinyl group, a styryl group, an allyl group, an epoxy group, or an oxetane group is preferable, and from the viewpoint of a high rate in the polymerization reaction rate, the (meth)acryloyl group is more preferable.

Examples of the rod-like polymerizable liquid crystal compound include the compounds described in claim 1 of JP1999-513019A (JP-H11-513019A) and paragraphs [0026] to [0098] of JP2005-289980A. Examples of the disk-like polymerizable liquid crystal compound include the compounds described in paragraphs [0020] to [0067] of JP2007-108732A and the compounds described in paragraphs [0013] to [0108] of JP2010-244038A.

Moreover, examples of the rod-like polymerizable liquid crystal compound include a liquid crystal compound capable of expressing a smectic phase, and include, for example, the compounds described in JP2016-051178A, JP2008-214269A, JP2008-019240A, and JP2006-276821A.

Furthermore, as the rod-like polymerizable liquid crystal compound, a polymerizable liquid crystal compound having a maximum absorption wavelength in a wavelength range of 330 to 380 nm is preferable.

In addition, the rod-like polymerizable liquid crystal compound is a preferably polymerizable liquid crystal compound having reciprocal wavelength dispersion.

Here, the polymerizable liquid crystal compound having "reciprocal wavelength dispersion" in the present specification means that in a case where an in-plane retardation value (Re) at a specific wavelength (visible range) of a phase difference film (an optically anisotropic layer and the like) manufactured using the polymerizable liquid crystal compound is measured, Re is equal to or higher as the measurement wavelength is increased.

Specifically, a polymerizable liquid crystal compound capable of forming an optically anisotropic layer satisfying the following formula is preferable.

$$Re(450)/Re(550) < 1.00$$

Here, in the formula, Re(450) represents an in-plane retardation at a wavelength of 450 nm of the optically anisotropic layer, and Re(550) represents an in-plane retardation at a wavelength of 550 nm of the optically anisotropic layer. The in-plane retardation value can be measured with light at a measurement wavelength using AxoScan OPMF-1 (manufactured by Opto Science, Inc.).

General Formulae (A1) to (A5)

The polymerizable liquid crystal compound is preferably a compound having a group selected from the group consisting of groups represented by General Formulae (A1) to (A5). By incorporation of such a group, reciprocal wavelength dispersion is easily incorporated into the polymerizable liquid crystal compound.

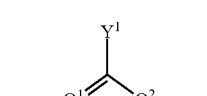

(A1)

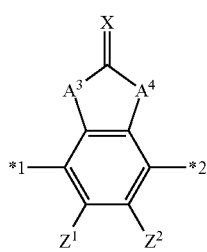

(A2)

(A3)

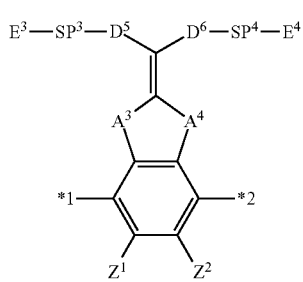

(A4)

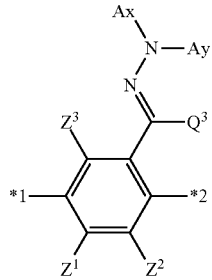

(A5)

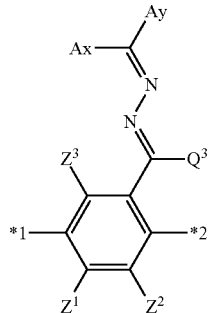

In General Formulae (A1) to (A5), *1 and *2 each represent a bonding position.

In General Formula (A1), $Q^1$ represents N or CH, $Q^2$ represents —S—, —O—, or —N($J^5$)-, $J^5$ represents a hydrogen atom or an alkyl group having 1 to 6 carbon atoms, and $Y^1$ represents an aromatic hydrocarbon group having 6 to 12 carbon atoms or an aromatic heterocyclic group having 3 to 12 carbon atoms, each of which may have a substituent.

Specific examples of the alkyl group having 1 to 6 carbon atoms represented by $J^5$ include a methyl group, an ethyl group, a propyl group, an isopropyl group, an n-butyl group, an isobutyl group, a sec-butyl group, a tert-butyl group, an n-pentyl group, and an n-hexyl group.

Examples of the aromatic hydrocarbon group having 6 to 12 carbon atoms represented by $Y^1$ include an aryl group such as a phenyl group, a 2,6-diethylphenyl group, and a naphthyl group.

Examples of the aromatic heterocyclic group having 3 to 12 carbon atoms represented by $Y^1$ include a heteroaryl group such as a thienyl group, a thiazolyl group, a furyl group, and a pyridyl group.

Furthermore, examples of the substituent which may be contained in $Y^1$ include an alkyl group, an alkoxy group, and a halogen atom.

As the alkyl group, for example, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, for example, an alkoxy group having 1 to 18 carbon atoms is preferable, an alkoxy group having 1 to 8 carbon atoms (for example, a methoxy group, an ethoxy group, an n-butoxy group, and a methoxy ethoxy group) is more preferable, an alkoxy group having 1 to 4 carbon atoms is still more preferable, and the methoxy group or the ethoxy group is particularly preferable.

Examples of the halogen atom include a fluorine atom, a chlorine atom, a bromine atom, and an iodine atom, and among those, the fluorine atom or the chlorine atom is preferable.

In addition, in General Formulae (A1) to (A5), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —$NJ^6J^7$, or —$SJ^8$, $J^6$ to $J^8$ each independently represent a hydrogen atom or an alkyl group having 1 to 6 carbon atoms, and $Z^1$ and $Z^2$ may be bonded to each other to form an aromatic ring.

As the monovalent aliphatic hydrocarbon group having 1 to 20 carbon atoms, an alkyl group having 1 to 15 carbon atoms is preferable, an alkyl group having 1 to 8 carbon atoms is more preferable, specifically, a methyl group, an ethyl group, an isopropyl group, a tert-pentyl group (1,1-dimethylpropyl group), a tert-butyl group, or a 1,1-dimethyl-3,3-dimethyl-butyl group is still more preferable, and the methyl group, the ethyl group, or the tert-butyl group is particularly preferable.

Examples of the monovalent alicyclic hydrocarbon group having 3 to 20 carbon atoms include a monocyclic saturated hydrocarbon group such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; a monocyclic unsaturated hydrocarbon group such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and cyclodecadiene; and a polycyclic saturated hydrocarbon group such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, and an adamantyl group.

Specific examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Examples of the halogen atom include a fluorine atom, a chlorine atom, a bromine atom, and an iodine atom, and among those, the fluorine atom, the chlorine atom, or the bromine atom is preferable.

On the other hand, examples of the alkyl group having 1 to 6 carbon atoms represented by each of $J^6$ to $J^8$ include a methyl group, an ethyl group, a propyl group, an isopropyl group, an n-butyl group, an isobutyl group, a sec-butyl group, a tert-butyl group, an n-pentyl group, and an n-hexyl group.

Moreover, in General Formulae (A2) and (A3), $A^3$ and $A^4$ each independently represent a group selected from the group consisting of —O—, —N($J^9$)-, —S—, and —CO—, and $J^9$ represents a hydrogen atom or a substituent.

Examples of the substituent represented by $J^9$ include the same ones as the substituents which may be contained in $Y^1$ in General Formula (A1).

Furthermore, in General Formula (A2), X represents a non-metal atom of Groups 14 to 16 to which a hydrogen atom or a substituent may be bonded.

In addition, examples of the non-metal atom of Groups 14 to 16 represented by X include an oxygen atom, a sulfur atom, a nitrogen atom having a substituent, and a carbon atom having a substituent, and examples of the substituent include an alkyl group, an alkoxy group, an alkyl-substituted alkoxy group, a cyclic alkyl group, an aryl group (for example, a phenyl group and a naphthyl group), a cyano group, an amino group, a nitro group, an alkylcarbonyl group, a sulfo group, and a hydroxyl group.

Moreover, in General Formula (A3), $D^5$ and $D^6$ each independently represent a single bond, —CO—O—, —C(=S)O—, —$CJ^1J^2$-, —$CJ^1J^2$-$CJ^3J^4$-, —O—$CJ^1J^2$-, —$CJ^1J^2$-O—$CJ^3J^4$-, —CO—O—$CJ^1J^2$-, —O—CO—$CJ^1J^2$-, —$CJ^1J^2$-O—CO—$CJ^3J^4$-, —$CJ^1J^2$-CO—O—$CJ^3J^4$-, —$NJ^1$-$CJ^2J^3$-, or —CO—$NJ^1$-. $J^1$, $J^2$, $J^3$, and $J^4$ each independently represent a hydrogen atom, a fluorine atom, or an alkyl group having 1 to 4 carbon atoms.

Furthermore, in General Formula (A3), $SP^3$ and $SP^4$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, and Q represents a substituent. Examples of the substituent include the same ones as the substituents which may be contained in $Y^1$ in General Formula (A1).

In addition, in General Formula (A3), $E^3$ and $E^4$ each independently represent a monovalent organic group.

Moreover, in General Formulae (A4) and (A5), Ax represents an organic group having 2 to 30 carbon atoms, which has at least one aromatic ring selected from the group consisting of an aromatic hydrocarbon ring and an aromatic heterocyclic ring.

In addition, in General Formulae (A4) and (A5), Ay represents a hydrogen atom, an alkyl group having 1 to 6 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom, or an alkyl group having 1 to 6 carbon atoms, which may have a substituent.

Examples of Ax and Ay include ones described in paragraphs [0039] to [0095] of WO2014/010325A.

Incidentally, examples of the alkyl group having 1 to 6 carbon atoms represented by $Q^3$ include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as the substituents which may be contained in $Y^1$ in General Formula (A1).

General Formula (W)

Among those, the polymerizable liquid crystal compound is preferably a polymerizable liquid crystal compound having reciprocal wavelength dispersion, represented by General Formula (W).

$E^1\text{-}SP^1\text{-}A^1\text{-}D^3\text{-}G^1\text{-}D^1\text{-}Ar\text{-}D^2\text{-}G\text{-}D^4\text{-}A^2\text{-}SP^2\text{-}E^2$ (W)

In General Formula (W), Ar represents any one group selected from the group consisting of the above-mentioned groups represented by General Formulae (A1) to (A5). Incidentally, in this case, it is preferable that in General Formulae (A1) to (A5), *1 represents a bonding position to $D^1$ and *2 represents a bonding position to $D^2$.

In General Formula (W), $D^1$, $D^2$, $D^3$, and $D^4$ each independently represent a single bond, —CO—O—, —C(=S)O—, —$CJ^1J^2$-, —$CJ^1J^2$-$CJ^3J^4$-, —O—$CJ^1J^2$-, —$CJ^1J^2$-O—, —$CJ^3J^4$-, —CO—O—$CJ^1J^2$-, —O—CO—$CJ^1J^2$-, —$CJ^1J^2$-O—CO—$CJ^3J^4$-, —$CJ^1J^2$-CO—O—$CJ^3J^4$-, —$NJ^1$-$CJ^2J^3$-, or —CO—$NJ^1$-. $J^1$, $J^2$, $J^3$, and $J^4$ each independently represent a hydrogen atom, a fluorine atom, or an alkyl group having 1 to 4 carbon atoms.

Moreover, in General Formula (W), $G^1$ and $G^2$ each independently represent a divalent alicyclic hydrocarbon group having 5 to 8 carbon atoms, and one or more of —$CH_2$-'s constituting the alicyclic hydrocarbon group may be substituted with —O—, —S—, or —NH—.

Furthermore, in General Formula (W), $A^1$ and $A^2$ each independently represent an aromatic ring group having 6 or more carbon atoms or a cycloalkylene ring group having 6 or more carbon atoms.

Incidentally, in General Formula (W), $SP^1$ and $SP^2$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms may be substituted with —O—, —S—, —NH—, —N(Q)-, or —CO—, and Q represents a substituent.

In addition, in General Formula (W), $E^1$ and $E^2$ each independently represent a monovalent organic group, and at least one of $E^1$ or $E^2$ represents a polymerizable group. It should be noted that in a case where Ar is the group represented by General Formula (A3), at least one of $E^1$ or $E^2$, or $E^3$ or $E^4$ in General Formula (A3) as described above represents a polymerizable group.

In General Formula (W), the divalent alicyclic hydrocarbon group having 5 to 8 carbon atoms represented by $G^1$ and $G^2$ is preferably a 5- or 6-membered ring. Further, the alicyclic hydrocarbon group may be saturated or unsaturated, but is preferably a saturated alicyclic hydrocarbon group. With regard to the divalent alicyclic hydrocarbon group represented by each of $G^1$ and $G^2$, reference can be made to the description in, for example, paragraph [0078] of JP2012-021068A, the contents of which are incorporated herein by reference.

In General Formula (W), examples of the aromatic ring group having 6 or more carbon atoms represented by each of $A^1$ and $A^2$ include an aromatic hydrocarbon ring group such as a benzene ring group, a naphthalene ring group, an anthracene ring group, and a phenanthroline ring group; and an aromatic heterocyclic group such as a furan ring group, a pyrrole ring group, a thiophene ring group, a pyridine ring group, a thiazole ring group, and a benzothiazole ring group. Among those, the benzene ring group (for example, a 1,4-phenyl group) is preferable.

In addition, in General Formula (W), examples of the cycloalkylene ring group having 6 or more carbon atoms represented by each of $A^1$ and $A^2$ include a cyclohexane ring group and a cyclohexene ring group, and among these, the cyclohexane ring (for example, a cyclohexane-1,4-diyl group) is preferable.

In General Formula (W), as the linear or branched alkylene group having 1 to 12 carbon atoms represented by each of $SP^1$ and $SP^2$, a methylene group, an ethylene group, a propylene group, or a butylene group is preferable.

In General Formula (W), the polymerizable group represented by at least one of $E^1$ or $E^2$ is not particularly limited, but a polymerizable group which is radically polymerizable or cationically polymerizable group is preferable.

As the radically polymerizable group, a generally known radically polymerizable group can be used, and an acryloyl group or a methacryloyl group is preferable. In this case, it is known that the acryloyl group generally exhibits a fast polymerization rate, the acryloyl group is preferable from the viewpoint of an improvement in productivity, but similarly, the methacryloyl group can also be used as a high-birefringence liquid crystalline polymerizable group.

A generally known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and an epoxy group, an oxetane group, or the vinyloxy group is more preferable.

Particularly preferred examples of the polymerizable group include the following groups.

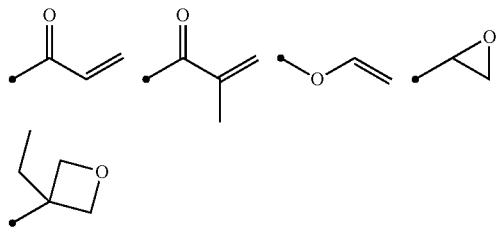

Preferred examples of the liquid crystal compound represented by General Formula (W) are shown below, but are not limited to these liquid crystal compounds. Further, the 1,4-cyclohexylene groups in the following formulae are all trans-1,4-cyclohexylene groups.

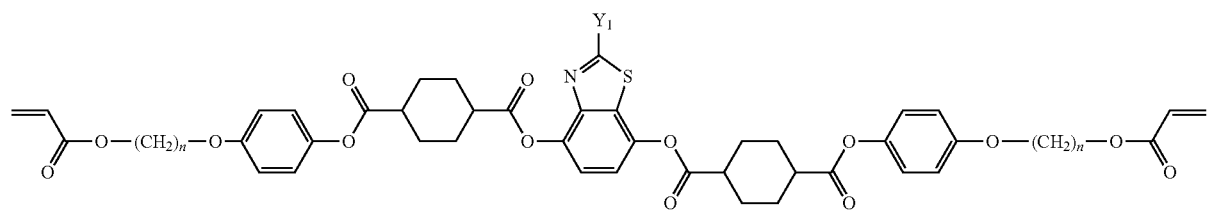
| No | Y1 | n |
|---|---|---|
| II-1-1 | phenyl | 6 |
| II-1-2 | 4-cyanophenyl | 6 |
| II-1-3 | 4-nitrophenyl | 6 |
| II-1-4 | 4-pyridyl | 6 |
| II-1-5 | 4-styrylphenyl | 6 |
| II-1-6 | 4-nitrophenyl | 11 |
-continued
| No | Y1 | n |
|---|---|---|
| II-1-7 | 4-nitrophenyl | 8 |
| II-1-8 | 4-nitrophenyl | 4 |
| II-1-9 | 2-thienyl | 6 |
| II-1-10 | 3-methyl-4-nitrophenyl | 6 |
| II-1-11 | 4,6-dimethylbenzofuran-2-yl | 6 |
| II-1-12 | 2-furyl | 6 |
| II-1-13 | 5-chloro-2-thienyl | 6 |

-continued
| No | Y1 | n |
|---|---|---|
| II-1-14 | thiazol-5-yl* | 6 |
| II-1-15 | 4-(SO₂CH₃)phenyl* | 6 |
| No | X | R1 |
|---|---|---|
| II-2-1 | CH(CN)₂* | H |
| II-2-2 | *CH(CN)C(O)OCH₃ | H |
| II-2-3 | *CH(CN)C(O)OBu | H |
II-1-16
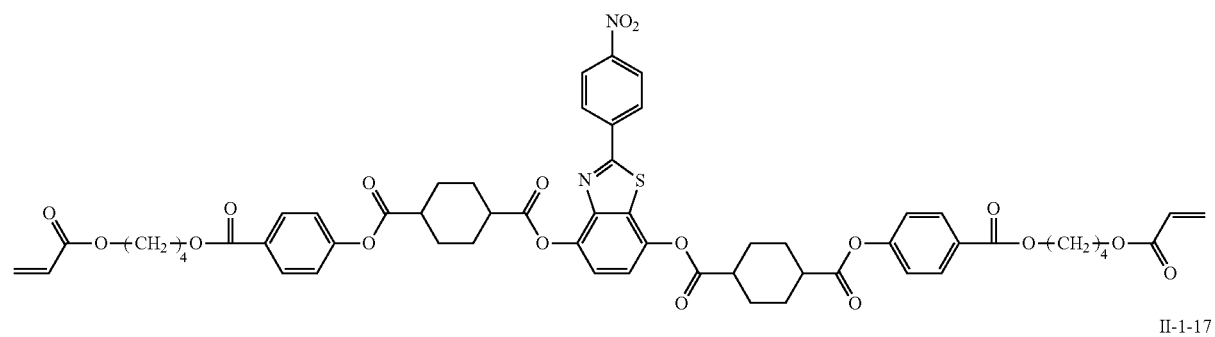
II-1-17
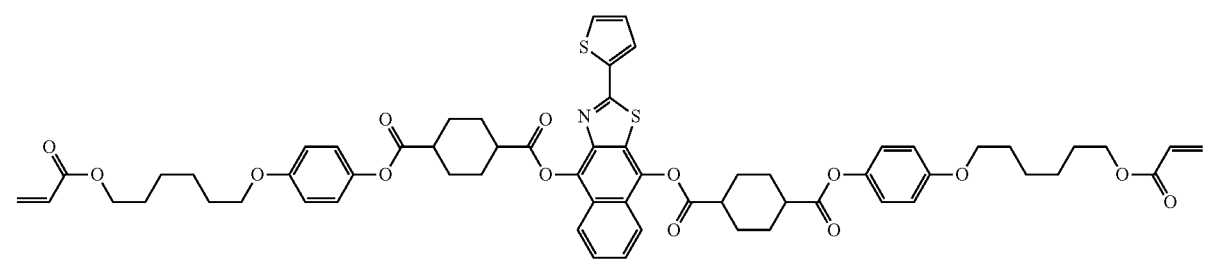
II-1-18
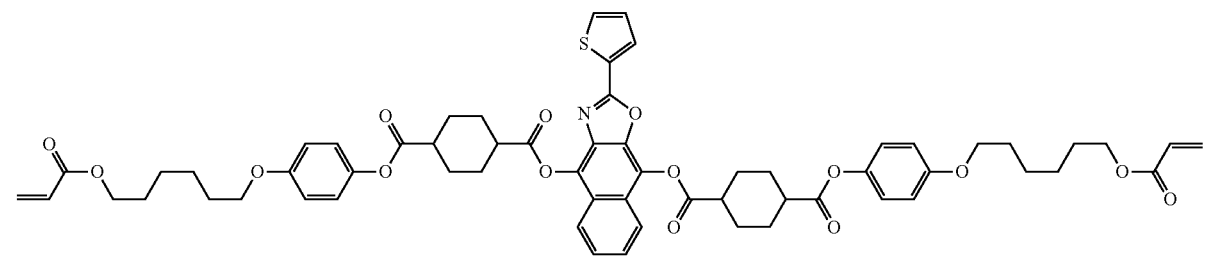
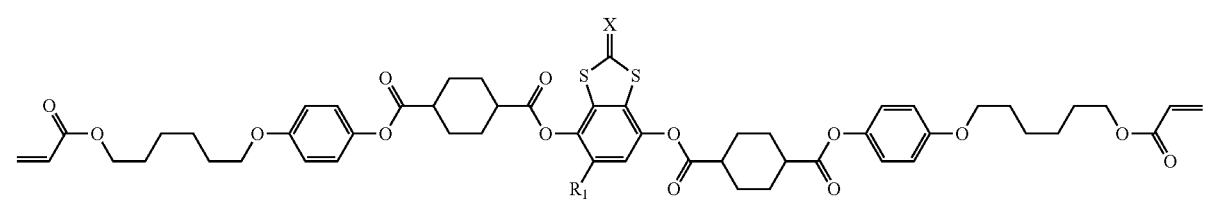

-continued

| No | X | R1 |
|---|---|---|
| II-2-4 | NC-CH2-C(=O)-O-CH2CH2-O-C(CH3)2-OH * | H |
| II-2-5 | NC-CH(*)-CN | CH₃ |
| II-2-6 | NC-CH(*)-CN | -C(CH₃)₃ |
| II-2-7 | S | H |

Furthermore, in the formulae, "*" represents a bonding position.

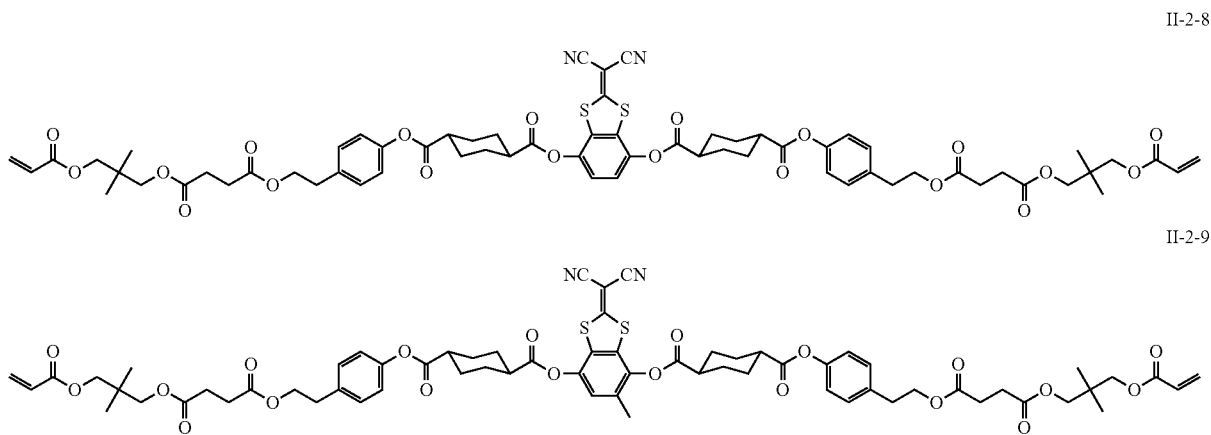

II-2-8

II-2-9

Moreover, a group adjacent to the acryloyloxy group in each of Formulae II-2-8 and II-2-9 represents a propylene group (a group in which a methyl group is substituted with an ethylene group), and represents a mixture of position isomers having different positions of the methyl groups.

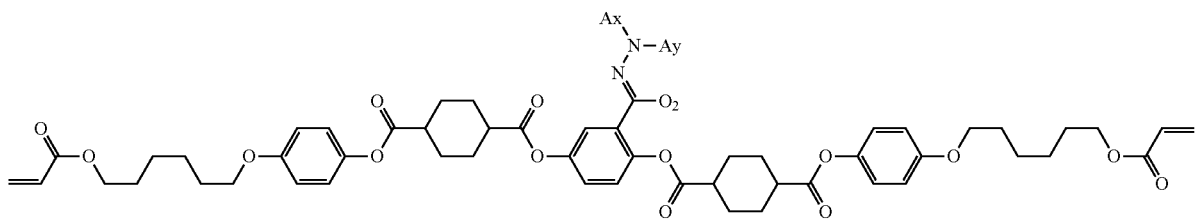

| No | Ax | Ay | Q2 |
|---|---|---|---|
| II-3-1 | benzothiazol-2-yl | H | H |
| II-3-2 | benzoxazol-2-yl | H | H |
| II-3-3 | naphthalen-1-yl | H | H |
| II-3-4 | Ph | Ph | H |
| II-3-5 | quinolin-2-yl | H | H |

-continued

| No | Ax | Ay | Q2 |
|---|---|---|---|
| II-3-6 | phthalazinyl | H | H |
| II-3-7 | benzothiazol-2-yl | CH$_3$ | H |
| II-3-8 | benzothiazol-2-yl | C$_4$H$_9$ | H |
| II-3-9 | benzothiazol-2-yl | C$_6$H$_{13}$ | H |
| II-3-10 | benzothiazol-2-yl | acryloyl | H |
| II-3-11 | benzothiazol-2-yl | benzothiazol-2-yl | H |
| II-3-12 | benzothiazol-2-yl | CH$_2$CN | H |
| II-3-13 | benzothiazol-2-yl | cyclohexyl | H |
| II-3-14 | benzothiazol-2-yl | isopentyl | H |
| II-3-15 | benzothiazol-2-yl | CH$_2$CH$_2$OH | H |

-continued

| No | Ax | Ay | Q2 |
|---|---|---|---|
| II-3-16 | fluoren-9-yl | H | H |
| II-3-17 | benzothiazol-2-yl | CH$_2$CF$_3$ | H |
| II-3-18 | benzothiazol-2-yl | H | CH$_3$ |
| II-3-19 | benzothiazol-2-yl | cyclohexylmethyl | H |
| II-3-20 | benzothiazol-2-yl | (CH$_2$)$_3$CN | H |
| II-3-21 | benzothiazol-2-yl | benzyl | H |
| II-3-22 | benzothiazol-2-yl | tosyl | H |
| II-3-23 | benzothiazol-2-yl | CH$_2$OCH$_2$CH$_2$OCH$_3$ | H |
| II-3-24 | benzothiazol-2-yl | butanoyl | H |
| II-3-25 | naphtho[1,2-d]thiazol-2-yl | C$_6$H$_{13}$ | H |

II-3-26
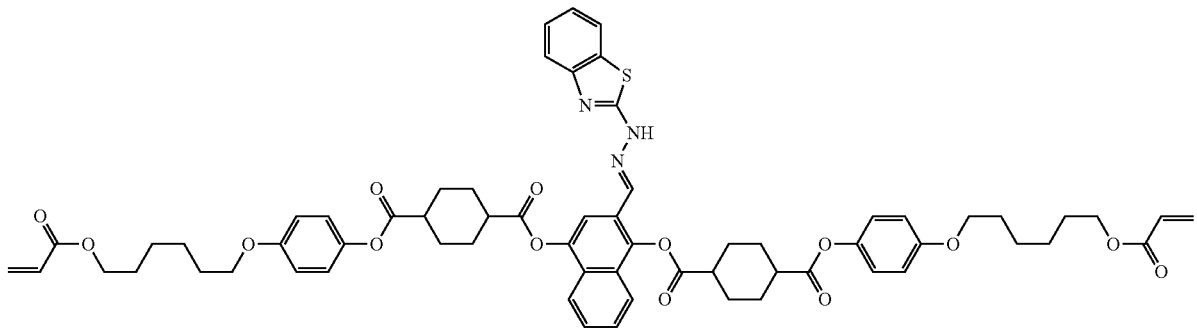
II-3-27
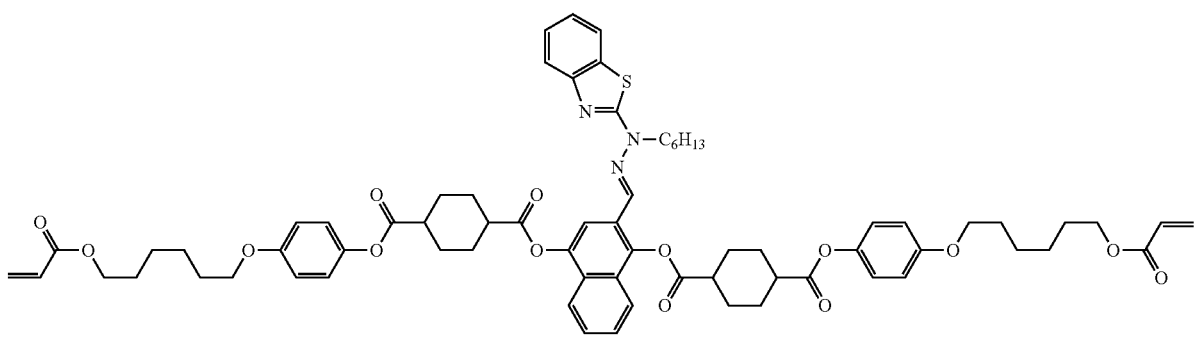
II-3-28
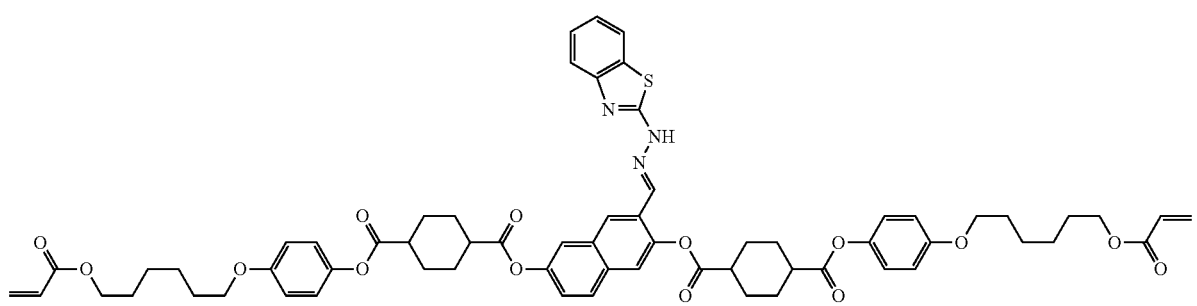
II-3-29
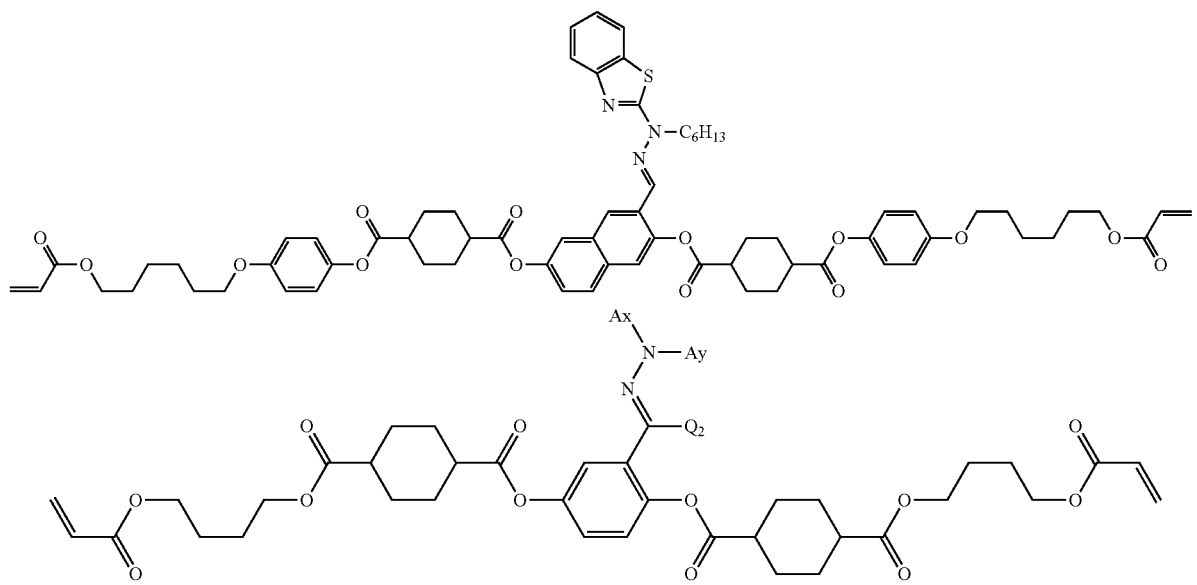

| No | Ax | Ay | Q2 |
|---|---|---|---|
| II-3-30 | 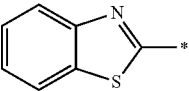 | H | H |
| II-3-31 | 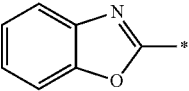 | H | H |
| II-3-32 | 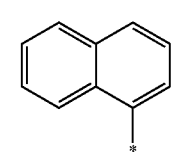 | H | H |
| II-3-33 | Ph | Ph | H |
| II-3-34 | 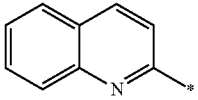 | H | H |
| II-3-35 | 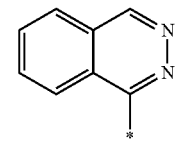 | H | H |
| II-3-36 | 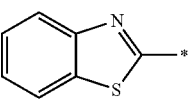 | $CH_3$ | H |
| II-3-37 | 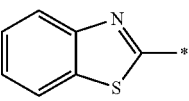 | $C_4H_9$ | H |
| II-3-38 | 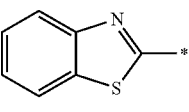 | $C_6H_{13}$ | H |
| II-3-39 | 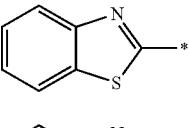 | 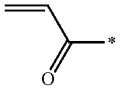 | H |
| II-3-40 | 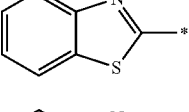 | 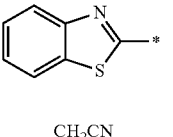 | H |
| II-3-41 | 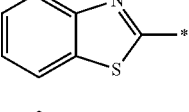 | $CH_2CN$ | H |
| II-3-42 | 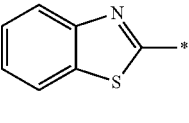 | 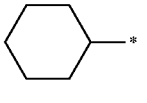 | H |
| II-3-43 | 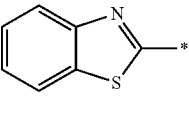 | 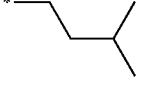 | H |
| No | Ax | Ay | Q2 |
|---|---|---|---|
| II-3-46 | 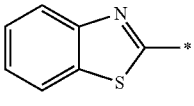 | $CH_2CH_2OH$ | H |
| II-3-45 | 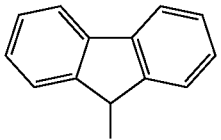 | H | H |
| II-3-46 | 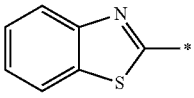 | $CH_2CF_3$ | H |
| II-3-47 | 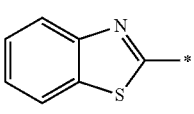 | H | $CH_3$ |
| II-3-48 | 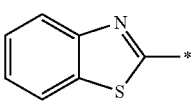 | 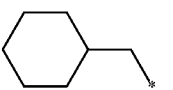 | H |
| II-3-49 | 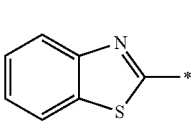 | 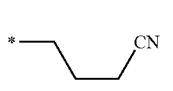 | H |
| II-3-50 | 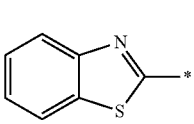 | 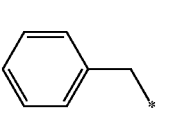 | H |
| II-3-51 | 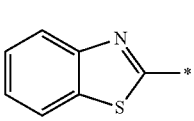 | 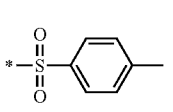 | H |
| II-3-52 | 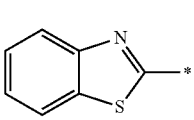 | 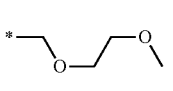 | H |
| II-3-53 | 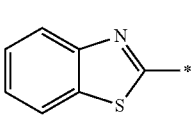 | 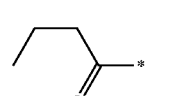 | H |
| II-3-54 | 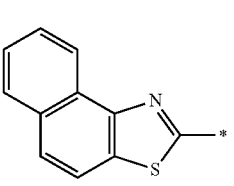 | $C_6H_{13}$ | H |

II-3-55
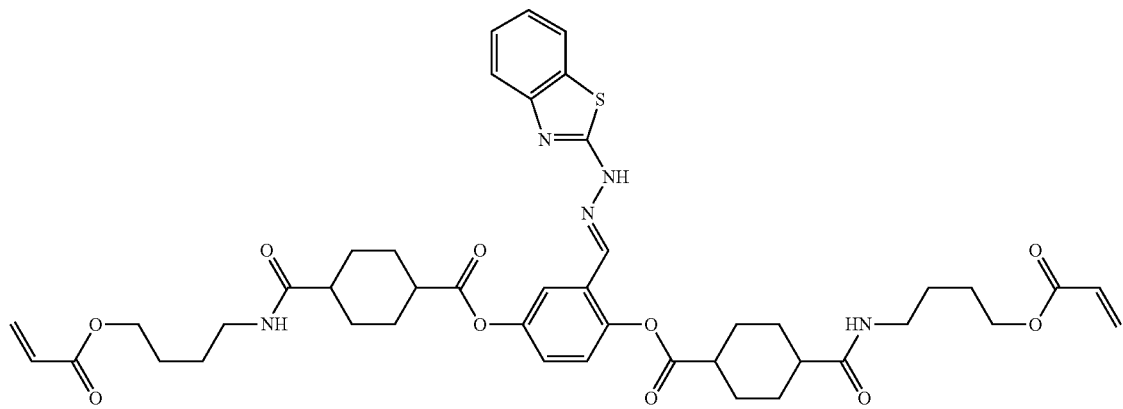
II-4-1
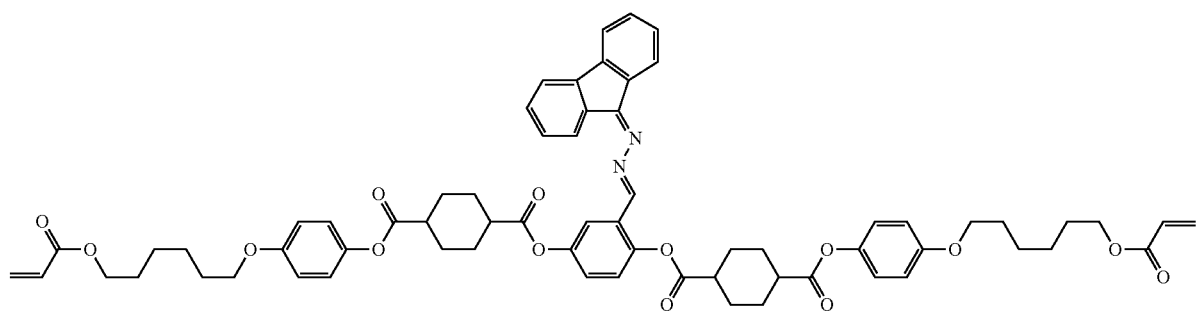
II-4-2
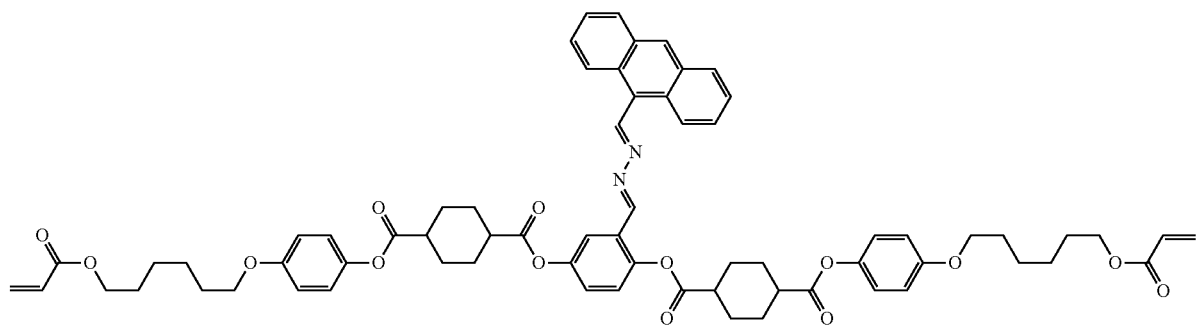
II-4-3
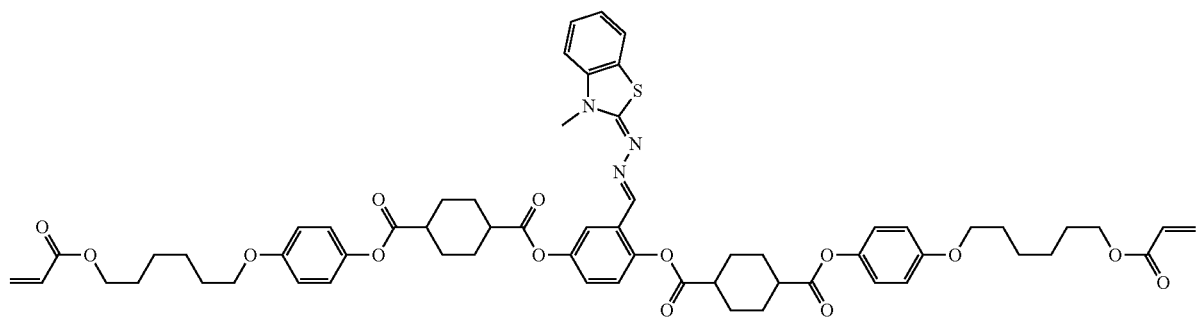

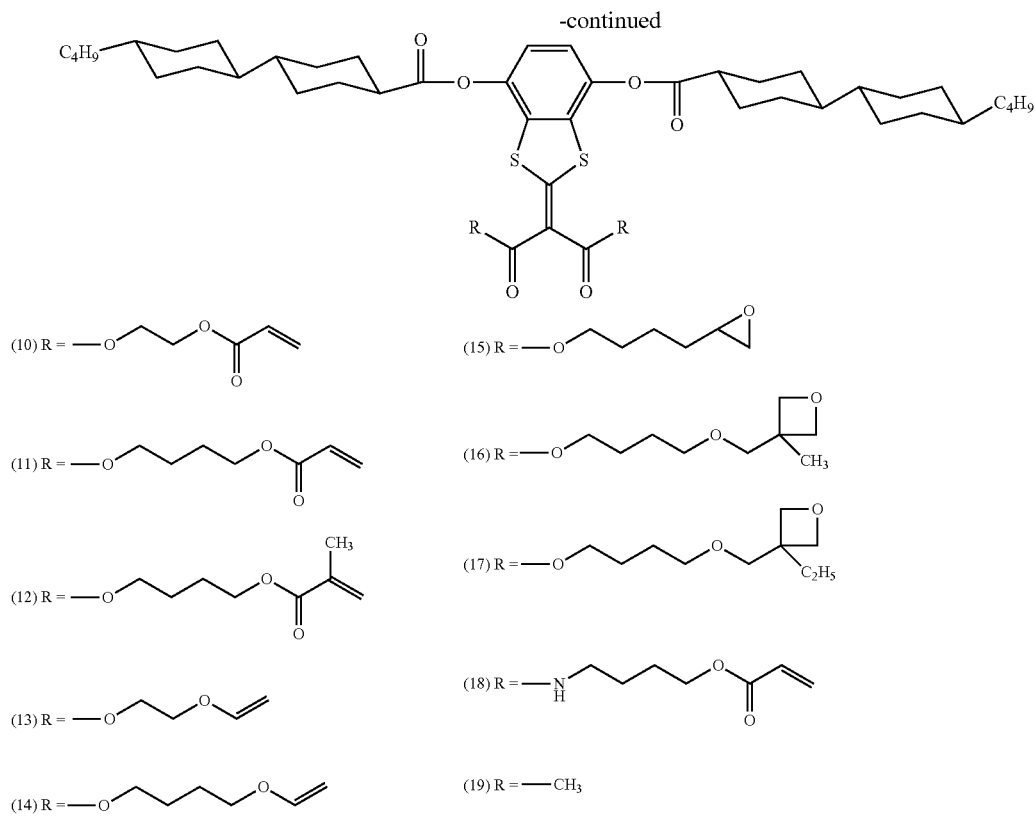

The polymerizable liquid crystal compounds may be used singly or in combination of two or more kinds thereof. From the viewpoint of suppressing the crystallinity of the polymerizable liquid crystal compound, thereby realizing good solubility and liquid crystallinity, it is preferable that two or more kinds of the polymerizable liquid crystal compounds are used. In addition, a polymerizable liquid crystal compound other than the above-mentioned polymerizable liquid crystal compounds may be used.

As the polymerizable liquid crystal compound, the polymerizable liquid crystal compound described in Handbook of Liquid Crystals (edited by Society of editing handbook of Liquid crystal, published by Maruzen on Oct. 30, 2000), and known polymerizable liquid crystal compounds may be used.

The content of the polymerizable liquid crystal compound in the liquid crystal composition is preferably 50% to 99.99% by mass, more preferably 65% to 99.5% by mass, and still more preferably 70% to 99% by mass, with respect to the total mass of the solid content of the liquid crystal composition.

The polymerizable liquid crystal compounds may be used singly or in combination of two or more kinds thereof.

In a case where two or more kinds of the polymerizable liquid crystal compounds are used, the total content thereof is preferably within the range.

The solid content of the liquid crystal composition is a component capable of forming an optically anisotropic layer and does not include a solvent. Further, even in a case where the properties and the state of the component are liquid phases and the component is also capable of forming an optically anisotropic layer, it is used for calculation of the solid content.

Moreover, in a case where a polymerizable liquid crystal compound having reciprocal wavelength dispersion (preferably the polymerizable liquid crystal compound represented by General Formula (W)) is used as the polymerizable liquid crystal compound, the content thereof is preferably 50% to 100% by mass, more preferably 65% to 95% by mass, and still more preferably 70% to 90% by mass, with respect to the total mass of the liquid crystal compound in the liquid crystal composition, from the viewpoint of imparting the optically anisotropic layer with reciprocal wavelength dispersion.

The polymerizable liquid crystal compounds having reciprocal wavelength dispersion (preferably the polymerizable liquid crystal compound represented by General Formula (W)) may be used singly or in combination of two or more kinds thereof. In a case where two or more kinds of the polymerizable liquid crystal compounds having reciprocal wavelength dispersion are used, the total content thereof is preferably within the range.

In addition, the total mass of the liquid crystal compound is a total mass of the compounds exhibiting liquid crystallinity in the liquid crystal composition, and in a case where the liquid crystal composition also includes a non-polymerizable liquid crystal compound, the total mass is a mass obtained by adding up not only the mass of the polymerizable liquid crystal compound but also the mass of the non-polymerizable liquid crystal compound.

(Fluoroaliphatic Group-Containing Copolymer)

The liquid crystal composition includes a fluoroaliphatic group-containing copolymer.

This fluoroaliphatic group-containing copolymer is a copolymer having at least a repeating unit derived from the fluoroaliphatic group-containing monomer represented by General Formula (1) and a repeating unit having a polymerizable group which is copolymerizable with the polymerizable liquid crystal compound. The copolymer may be either a random copolymer or a block copolymer.

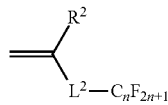
(1)

Repeating Unit Derived from Fluoroaliphatic Group-Containing Monomer Represented by General Formula (1)

In General Formula (1), $R^2$ represents a hydrogen atom, a halogen atom (a fluorine atom, a chlorine atom, a bromine atom, an iodine atom, or the like), or an alkyl group.

The alkyl group may have a substituent. The number of carbon atoms of the alkyl group is preferably 1 to 6.

Among those, $R^2$ preferably represents a hydrogen atom or a methyl group.

In General Formula (1), $L^2$ represents a divalent linking group.

$L^2$ is preferably a divalent linking group selected from —O—, —NR$^{a11}$— (provided that $R^{a11}$ represents a hydrogen atom, an aliphatic hydrocarbon group having 1 to 10 carbon atoms, or an aryl group having 6 to 20 carbon atoms), —S—, —CO—, —SO$_2$—, a substituted or unsubstituted alkylene group having 1 to 20 carbon atoms, or a group formed by linking two or more of these groups.

Examples of the divalent linking group formed by linking two or more of the groups include —CO—O—, —O—CO—O—, —CO—NH—, and —CO—O—(CH$_2$)$_{ma}$O— (provided that ma represents an integer of 1 to 20).

Among those, as the divalent linking group, —O—, —CO—O—, —CO—NH—, or a group formed by combination of one or more of these groups with an alkylene group (for example, General Formulae (L-1) to (L-3)) is more preferable.

In General Formulae (L-1) to (L-3), * represents a bonding position to the vinylidene group in General Formula (1). m represents an integer of 1 to 20, and is preferably 2 to 16, more preferably 2 to 12, and still more preferably 2 to 6.

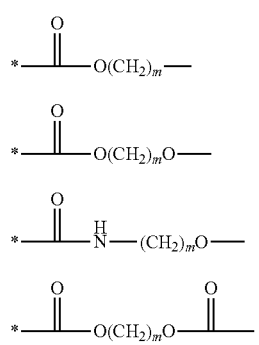

In General Formula (1), n represents an integer of 1 to 6, and is preferably 4 to 6.

The fluoroaliphatic group-containing monomer represented by General Formula (1) will be exemplified below.

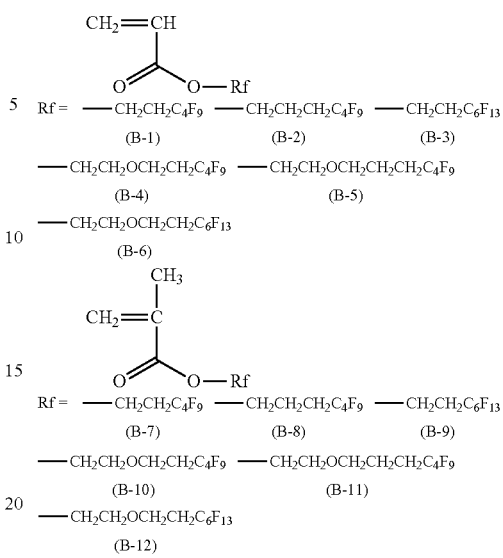

The content of the repeating unit derived from the fluoroaliphatic group-containing monomer represented by General Formula (1) is preferably 5% to 90% by mole, more preferably 10% to 80% by mole, and still more preferably 15% to 75% by mole, with respect to all the repeating units of the fluoroaliphatic group-containing copolymer.

The repeating units derived from the fluoroaliphatic group-containing monomer represented by General Formula (1) may be used singly or in combination of two or more kinds thereof. In a case where two or more kinds of the repeating units derived from the fluoroaliphatic group-containing monomer represented by General Formula (1) are used, the total content thereof is preferably within the range.

Repeating Unit Having Polymerizable Group

The fluoroaliphatic group-containing copolymer also has a repeating unit having a polymerizable group which is copolymerizable with the above-mentioned polymerizable liquid crystal compound.

The type of the polymerizable group contained in the repeating unit is not particularly limited as long as it is copolymerizable with the polymerizable liquid crystal compound. The polymerizable group is preferably a functional group capable of performing an addition polymerization reaction, and also preferably an ethylenically unsaturated polymerizable group or a ring polymerizable group. More specifically, a (meth)acryloyl group, a vinyl group, a styryl group, an allyl group, an epoxy group, or an oxetane group is preferable, and among these, the (meth)acryloyl group is more preferable from the viewpoint that the polymerization reaction has a high rate.

Among those, the polymerizable group is preferably an ethylenically unsaturated group, and more preferably a (meth)acryloyl group.

It should be noted that from the viewpoint of reactivity, a polymerizable group such as the polymerizable group contained in the polymerizable liquid crystal compound is also preferably contained.

As the repeating unit having a polymerizable group, a repeating unit represented by General Formula (X) is preferable.

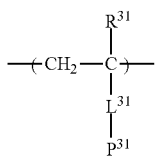
(X)

In General Formula (X), $R^{31}$ represents a hydrogen atom or an alkyl group having 1 to 4 carbon atoms, and is preferably a hydrogen atom or a methyl group.

$L^{31}$ is a single bond or a divalent linking group, and preferably a single bond, —O—, —CO—O—, —CO—NH—, an alkylene group, or an arylene group.

$P^{31}$ represents a monovalent group including a polymerizable group. Examples of the polymerizable group are as described above.

As $P^{31}$, a monovalent group having an ethylenically unsaturated group is preferable, a monovalent group having a group selected from the group consisting of a (meth)acryloyl group and a styryl group is more preferable, and the monovalent group having a (meth)acryloyl group is still more preferable.

As $P^{31}$, "-alkylene group-(single bond or ether group)-ethylenically unsaturated group" or "-alkylene group-$L^x$-alkylene group-(single bond or ether group)-ethylenically unsaturated group" is preferable. In addition, the numbers of carbon atoms of the alkylene groups are each independently preferably 1 to 4. $L^x$ is a divalent linking group other than the alkylene group, and preferably —O—, —CO—O—, —CO—NH—, or —O—CO—NH—.

The repeating unit represented by General Formula (X) is exemplified below.

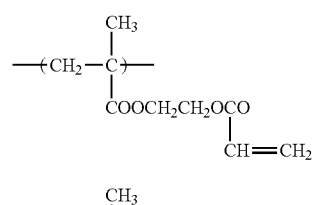
(A-1)

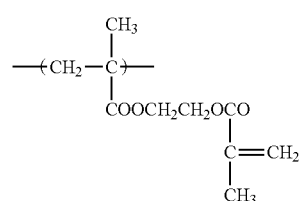
(A-2)

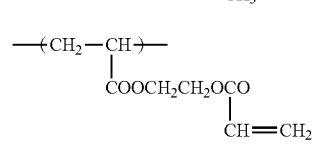
(A-3)

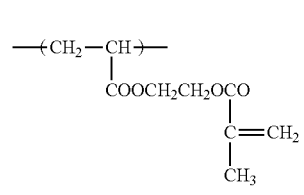
(A-4)

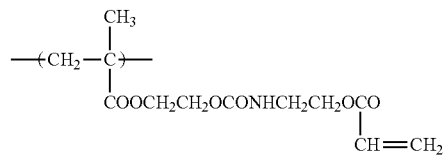
(A-5)

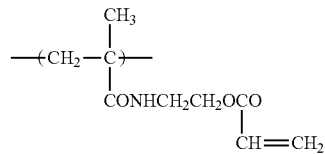
(A-6)

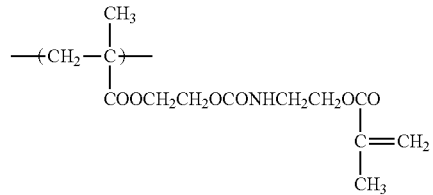
(A-7)

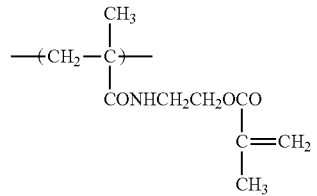
(A-8)

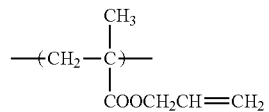
(A-9)

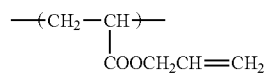
(A-10)

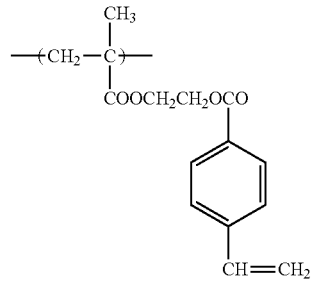
(A-11)

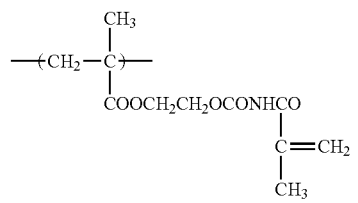
(A-12)

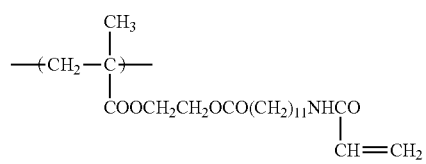
(A-13)

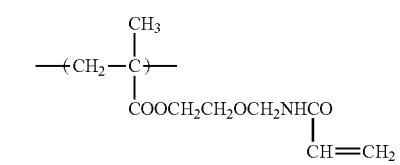
(A-14)
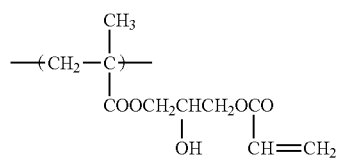
(A-15)
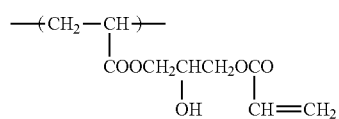
(A-16)
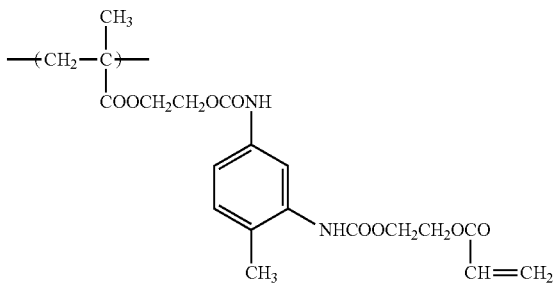
(A-17)
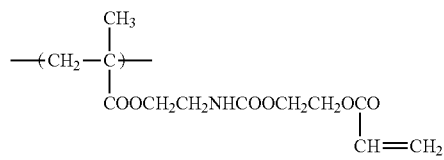
(A-18)
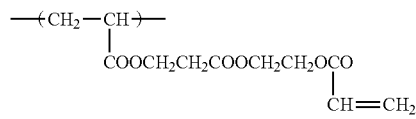
(A-19)
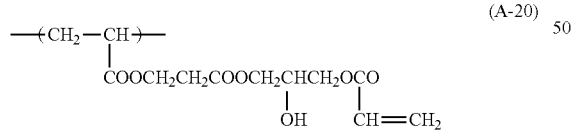
(A-20)
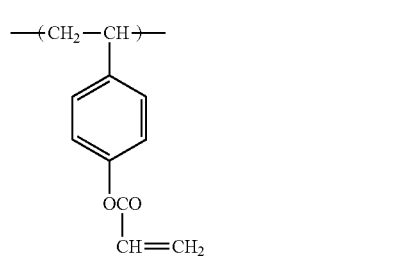
(A-21)
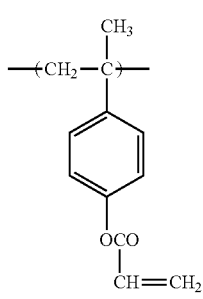
(A-22)
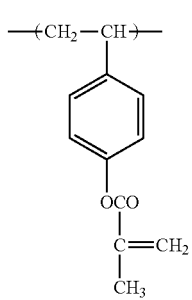
(A-23)
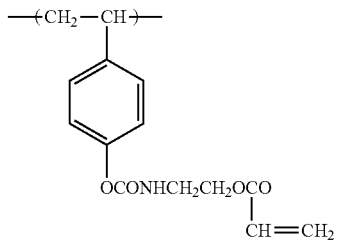
(A-24)
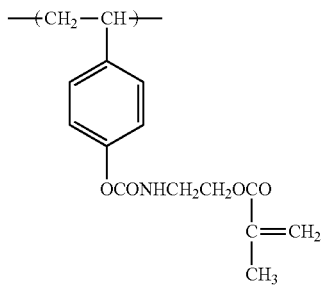
(A-25)
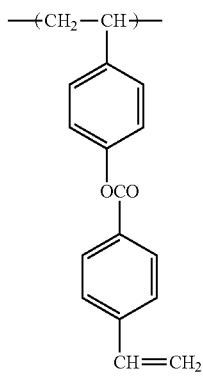
(A-26)

(A-27) 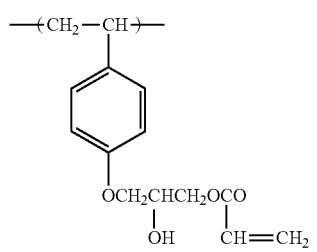
(A-28) 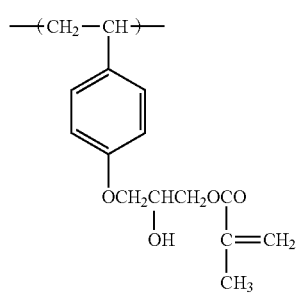
(A-29) 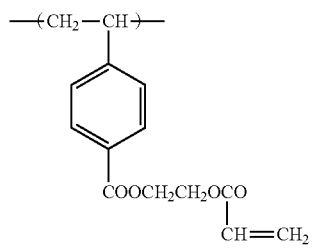
(A-30) 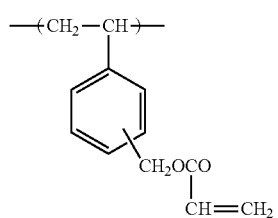
(A-31) 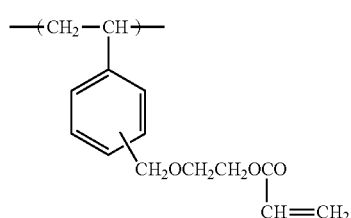
(A-32) 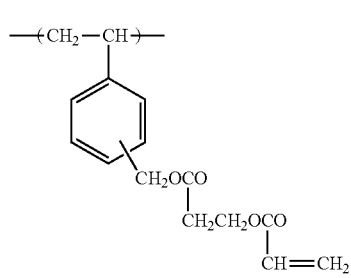
(A-33) 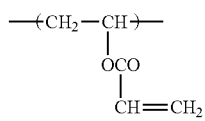
(A-34) 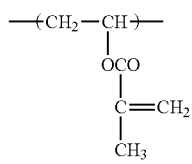
(A-35) 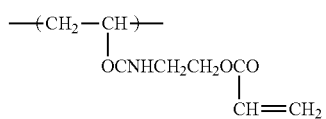
(A-36) 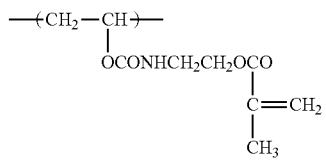
(A-37) 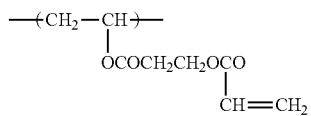
(A-38) 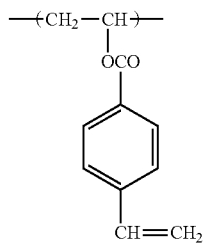
(A-39) 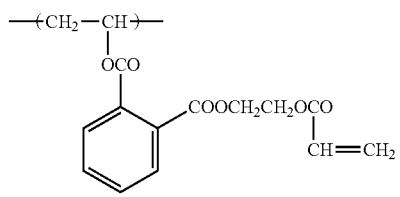
(A-40) 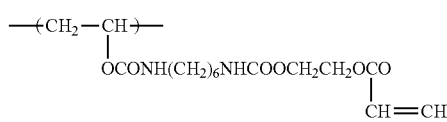
(A-41) 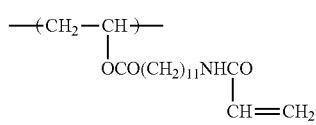
(A-42) 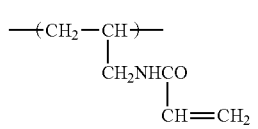

-continued

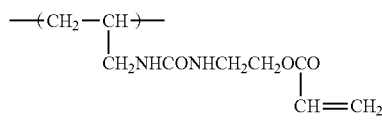
(A-43)

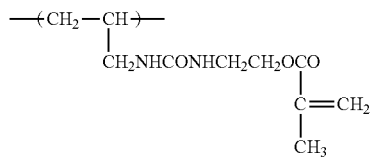
(A-44)

The content of the repeating unit having a polymerizable group is preferably 5% to 90% by mole, more preferably 7% to 80% by mole, and still more preferably 9% to 75% by mole, with respect to all the repeating units of the fluoroaliphatic group-containing copolymer.

The repeating units having a polymerizable group may be used singly or in combination of two or more kinds thereof. In a case where two or more kinds of the repeating units having a polymerizable group are used, the total content thereof is preferably within the range.

Repeating Unit Derived from Terminal Cyclic Hydrocarbon Group-Containing Monomer It is also preferable that the fluoroaliphatic group-containing copolymer further has a repeating unit derived from a terminal cyclic hydrocarbon group-containing monomer.

The terminal cyclic hydrocarbon group-containing monomer is a compound having a monovalent cyclic hydrocarbon group.

The cyclic hydrocarbon group may or may not have a substituent.

The cyclic hydrocarbon group may be either an aromatic ring group or a group not having aromaticity such as an alicyclic group (a cyclohexane ring group, a cyclohexene ring group, or the like). Among those, the cyclic hydrocarbon group is preferably an aromatic ring group. In other words, the terminal cyclic hydrocarbon group-containing monomer is preferably a terminal aromatic hydrocarbon-containing monomer.

The cyclic hydrocarbon group may be either a monocyclic ring or a fused ring. The cyclic hydrocarbon group which is a fused ring is preferably a group in which 2 to 5 rings are fused.

In addition, in the cyclic hydrocarbon group, one or more of the carbon atoms constituting the ring may be substituted with a heteroatom (an oxygen atom, a nitrogen atom, a sulfur atom, or the like). In this case, it is preferable that the cyclic hydrocarbon group is a fused ring and one or more of rings constituting the fused ring are all carbon atoms.

The number of carbon atoms of the cyclic hydrocarbon group is preferably 5 to 30.

As the cyclic hydrocarbon group, each a substituted or unsubstituted, a phenyl group, an indenyl group (a methylindenyl group, a methoxyindenyl group), or an indenyl group substituted with a heteroatom (for example, a benzofuranyl group, a thionaphthenyl group, an indolyl group, an indazolyl group, a benzimidazolyl group, a benzotriazolyl group, and a 1-pyrazolepyrazinyl group), a naphthyl group (a methylnaphthyl group, a cyanonaphthyl group, a fluoronaphthyl group, a bromonaphthyl group, and a naphthyl group substituted with a heteroatom (for example, a quinolyl group, an isoquinolyl group, a quinazolyl group, a quinoxalinyl group, a 6,7-pyridopyridazinyl group, a benzotetrazinyl group, and a pteryl group)), a fluorenyl group (a 2,7-dimethylfluorenyl group and a fluorenyl group substituted with a heteroatom (for example, a carbazolyl group, a dibenzofuranyl group, and a dibenzothiophenyl group)), an anthryl group (a 5-methylanthryl group and an anthryl group substituted with a heteroatom (for example, a xanthenyl group, an acridinyl group, and a phenazinyl group)), a pyrenyl group, a perylenyl group, or a phenanthrenyl group is preferable, a substituted or unsubstituted naphthyl group is more preferable, and an unsubstituted naphthyl group is still more preferable.

The terminal cyclic hydrocarbon group-containing monomer is preferably a monomer represented by General Formula (2).

(2)

In General Formula (2), $R^1$ represents a hydrogen atom, a halogen atom (a fluorine atom, a chlorine atom, a bromine atom, an iodine atom, or the like), or an alkyl group.

The alkyl group may have a substituent. The number of carbon atoms of the alkyl group is preferably 1 to 6.

Among those, $R^1$ is preferably a hydrogen atom or a methyl group.

In General Formula (2), $L^1$ represents a divalent linking group having an alkylene group having 2 or more carbon atoms, which may have a substituent.

$L^1$ is preferably a group represented by "-$L^a$-AL-$L^b$-".

Here, AL represents an alkylene group having 2 or more carbon atoms (preferably having 2 to 6 carbon atoms), which may have a substituent.

$L^a$ and $L^b$ each independently represent a single bond or a divalent linking group.

In addition, $L^a$ is a group bonding to the vinylidene group in General Formula [2] and $L^b$ is a group bonding to Y in General Formula (2).

Specific examples of the divalent linking groups of $L^a$ and $L^b$ each independently include a substituted or unsubstituted alkylene group (preferably having 1 to 20 carbon atoms, for example, a methylene group, an ethylene group, a propylene group, a butylene group, and an isopropylene group), an alkenylene group having 2 to 20 carbon atoms (preferably having 1 to 20 carbon atoms, for example, a vinylene group and a butene group), —O—, —$NR^{a1}$—, —S—, —$PR^{a2}$—, —$Si(R^{a3})(R^{a4})$—, —CO—, —CO—O—, —CO—$NR^{a5}$, —O—CO—O—, —O—CO—$NR^{a6}$—, —$NR^{a7}$—CO—$NR^{a8}$—, —$SO_2$—, and a group formed by linking two or more of these groups.

$R^{a1}$ to $R^{a8}$ each represent a hydrogen atom or a substituent.

Moreover, $L^1$ is also preferably a group represented by each of General Formulae (M-1) to (M-7).

In General Formulae (M-1) to (M-7), * represents a bonding position to the vinylidene group in General Formula (2). p represents an integer of 2 to 20, and is preferably 2 to 16, more preferably 2 to 12, and still more preferably 2 to 6.

(M-1)

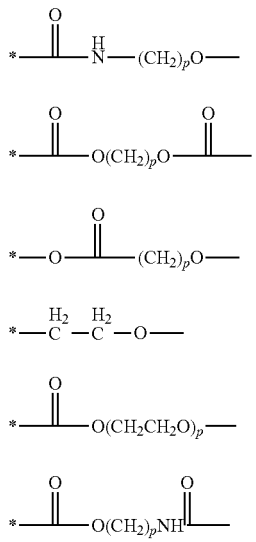

(M-2)
(M-3)
(M-4)
(M-5)
(M-6)
(M-7)

In General Formula (2), Y represents an aromatic ring group which may have a substituent.

The aromatic ring group may be either a monocyclic ring or a fused ring. The aromatic ring group which is a fused ring is preferably a group in which 2 to 5 rings are fused.

In addition, in the aromatic ring group, one or more of the carbon atoms constituting the ring may be substituted with a heteroatom (an oxygen atom, a nitrogen atom, a sulfur atom, or the like). In this case, it is preferable that the aromatic ring group is a fused ring and one or more of rings constituting the fused ring are all carbon atoms.

The number of carbon atoms of the aromatic ring group is preferably 5 to 30.

Specific examples of the aromatic ring group include the same groups of the groups mentioned above as suitable examples of the cyclic hydrocarbon group contained in the terminal cyclic hydrocarbon group-containing monomer.

Examples of the repeating unit derived from a terminal cyclic hydrocarbon group-containing monomer are shown below.

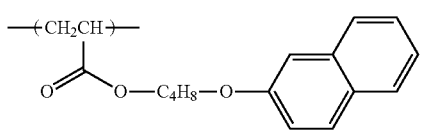

A-1

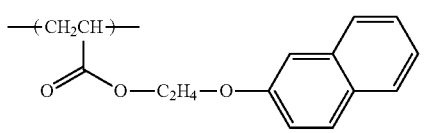

A-2

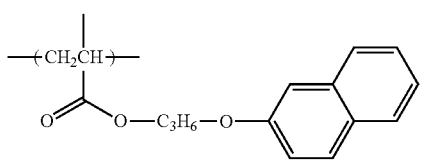

A-3

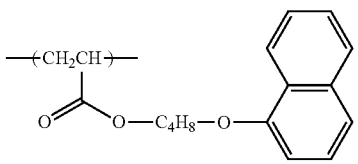

A-4

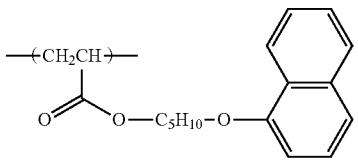

A-5

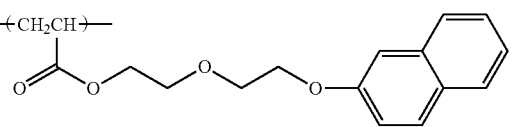

A-6

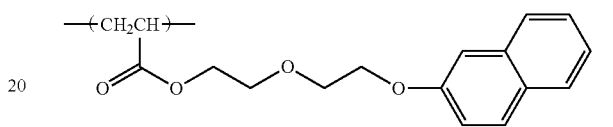

A-7

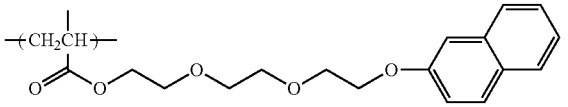

A-8

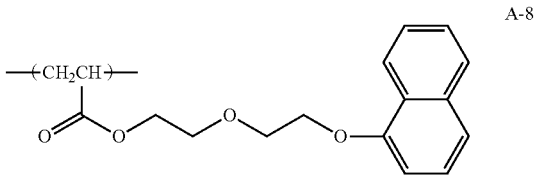

A-9

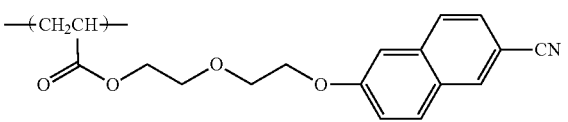

A-10

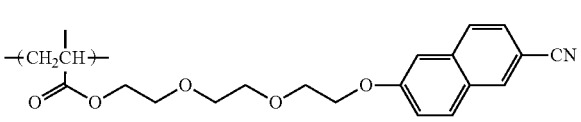

A-11

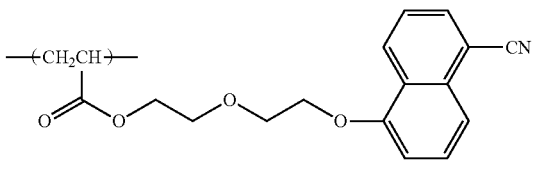

A-12

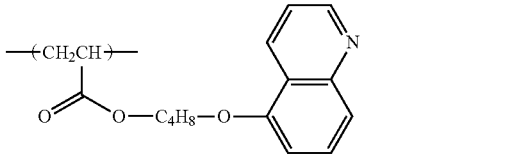

A-13

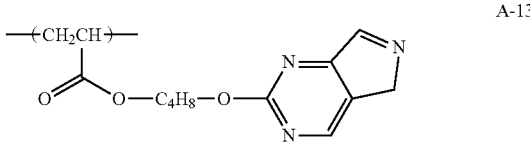

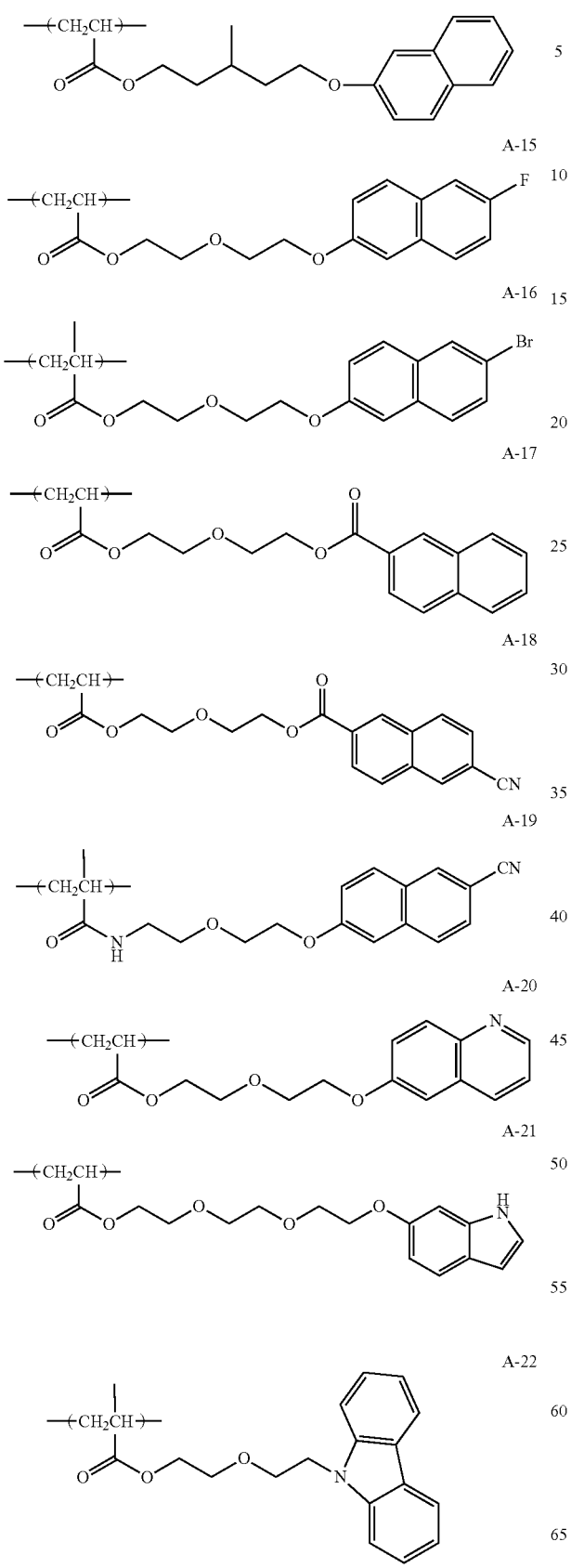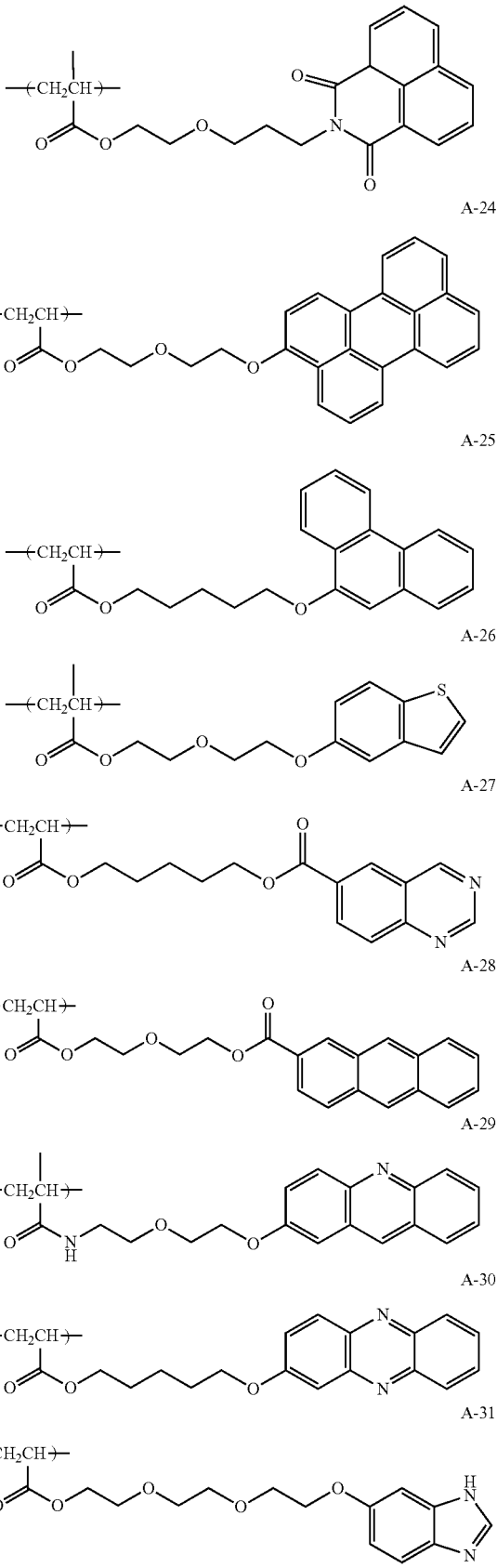

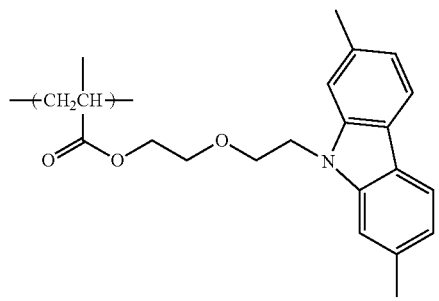

A-32

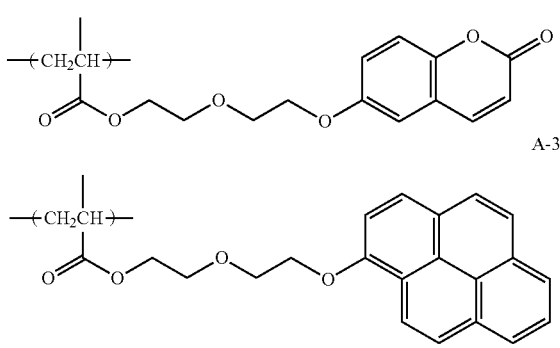

A-33

A-34

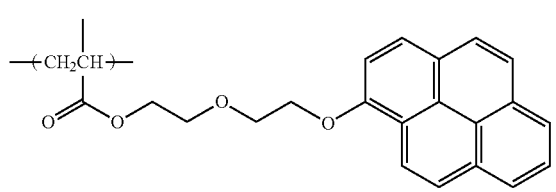

In a case where the fluoroaliphatic group-containing copolymer has a repeating unit derived from a terminal cyclic hydrocarbon group-containing monomer, the content thereof is preferably 5% to 90% by mole, more preferably 10% to 80% by mole, and still more preferably 15% to 75% by mole, with respect to all the repeating units of the fluoroaliphatic group-containing copolymer.

The repeating units derived from a terminal cyclic hydrocarbon group-containing monomer may be used singly or in combination of two or more kinds thereof. In a case where two or more kinds of the repeating units derived from a terminal cyclic hydrocarbon group-containing monomer are used, the total content thereof is preferably within the range.

Repeating Unit Having Crosslinking Group

The fluoroaliphatic group-containing copolymer may further have a repeating unit having a crosslinking group.

In a case where the fluoroaliphatic group-containing copolymer has the repeating unit having a crosslinking group, the adhesiveness of the optically anisotropic layer is more excellent.

It is preferable that a group crosslinkable with a layer in direct contact with the air interface side of the optically anisotropic layer or a functional group contained in a compound included in a material (composition) for forming the layer in direct contact with the air interface side of the optically anisotropic layer or is selected as the crosslinking group.

For example, in a case where an adhesive layer is directly arranged on the air interface side of the optically anisotropic layer and the adhesive layer is formed of an epoxy-based adhesive, it is preferable that the repeating unit having a crosslinking group has a group (a hydroxyl group, an oxetane group, an epoxy group, an amino group, or the like) which is crosslinkable with an epoxy group as the crosslinking group. With this configuration, the epoxy group contained in the epoxy-based adhesive and the crosslinking group of the repeating unit having a crosslinking group are crosslinked, and thus, the adhesiveness between the optically anisotropic layer and the adhesive layer is more excellent.

Examples of the crosslinking group include a hydroxyl group, an oxetane group, a carboxy group, an amino group (primary, secondary, and tertiary amino groups), an isocyanate group, an epoxy group, and an alkoxysilyl group.

In addition, examples of the functional group crosslinkable with these crosslinking groups include combinations as follows.

(crosslinking group:functional groups)=(hydroxyl group: isocyanate group), (hydroxyl group:halogenated benzyl group), (hydroxyl group:carboxylic anhydride group), (hydroxyl group:epoxy group), (hydroxyl group:alkoxysilyl group), (oxetane group:epoxy group), (carboxy group:primary or secondary amino group), (carboxy group:aziridine group), (carboxy group:isocyanate group), (carboxy group: epoxy group), (carboxy group:halogenated benzyl group), (primary or secondary amino group:isocyanate group), (primary, secondary, or tertiary amino group:halogenated benzyl group), (primary amino group:aldehydes), (isocyanate group:primary or secondary amino group), (isocyanate group:isocyanate group), (isocyanate group:hydroxyl group), (isocyanate group:epoxy group), (epoxy group:primary or secondary amino group), (epoxy group:carboxylic anhydride group), (epoxy group:hydroxyl group), (epoxy group: epoxy group), (alkoxysilyl group:alkoxysilyl group)

In addition, the crosslinking group is preferably a group which is different from the polymerizable group contained in the repeating unit having a polymerizable group. In other words, the crosslinking group is preferably a group which is not polymerized with the polymerizable liquid crystal compound. For example, the crosslinking group is preferably a group other than the ethylenically unsaturated group.

Moreover, the crosslinking group may have a substituent, if possible.

For example, the oxetane group as the crosslinking group is preferably a group represented by General Formula [O]. In General Formula [O], $R^O$ represents a hydrogen atom or a substituent (preferably an alkyl group having 1 to 3 carbon atoms). * represents a bonding position.

(O)

The repeating units having a crosslinking group may be used singly or in combination of two or more kinds thereof. In a case where two or more kinds of the repeating units having a crosslinking group are used, the repeating units having a crosslinking group may have the same or different crosslinking groups.

In addition, one of the repeating units having a crosslinking group may have two or more crosslinking groups, and in this case, the two or more crosslinking groups may be the same as or different from each other.

The repeating unit having a crosslinking group is preferably a repeating unit represented by General Formula (Y).

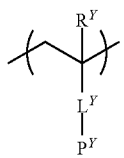

(Y)

In General Formula (Y), $R^Y$ represents a hydrogen atom or an alkyl group having 1 to 4 carbon atoms, and is preferably a hydrogen atom or a methyl group.

$L^Y$ is a single bond or a divalent linking group, and preferably a single bond, —O—, —CO—O—, —CO—NH—, an alkylene group, or an arylene group.

$P^Y$ represents a monovalent group having a crosslinking group.

As specific examples of $P^Y$, "-alkylene group-crosslinking group" is preferable. Further, the number of carbon atoms of the alkylene group is preferably 1 to 4.

In a case where the fluoroaliphatic group-containing copolymer has a repeating unit having a crosslinking group, the content thereof is preferably 5% to 90% by mole, more preferably 7% to 80% by mole, and still more preferably 10% to 75% by mole, with respect to all the repeating units of the fluoroaliphatic group-containing copolymer.

In a case where two or more kinds of the repeating units having a crosslinking group are used, the total content thereof is preferably within the range.

The fluoroaliphatic group-containing copolymer may also have repeating units other than the above-mentioned repeating units.

The weight-average molecular weight (Mw) of the fluoroaliphatic group-containing copolymer is preferably 1,000 to 500,000, more preferably 1,500 to 400,000, and still more preferably 2,000 to 300,000.

The number-average molecular weight (Mn) of the fluoroaliphatic group-containing copolymer is preferably 500 to 250,000, more preferably 1,000 to 200,000, and still more preferably 1,500 to 150,000.

The dispersity (Mw/Mn) of the fluoroaliphatic group-containing copolymer is preferably 1.00 to 20.00, more preferably 1.00 to 18.00, and still more preferably 1.00 to 16.00.

With the values in the ranges, the miscibility with the liquid crystal composition is excellent, and it is possible satisfy both of the uniformity in the alignment of the optically anisotropic layer, which is a main object of the present invention, and the adhesiveness to other optically functional layers.

The content of the fluoroaliphatic group-containing copolymer in the liquid crystal composition is preferably 0.005% to 5.00% by mass, more preferably 0.05 to 1.00% by mass, still more preferably 0.10% to 0.40% by mass, and particularly preferably 0.10% to 0.30% by mass, with respect to the total mass of the liquid crystal compound.

In a case where two or more kinds of the fluoroaliphatic group-containing copolymers are used, the total content thereof is preferably within the range.

In addition, the total solid content is intended to mean components that form the optically anisotropic layer, and does not include a solvent. Further, the components that form the optically anisotropic layer are considered to be the solid content even in a case where they are in the state of liquid.

(Polymerization Initiator)

The liquid crystal composition may include a polymerization initiator.

The polymerization initiator to be used is selected depending on the type of the polymerization reaction, and examples thereof include a thermal polymerization initiator and a photopolymerization initiator.

Examples of the photopolymerization initiator include a benzoin compound, a benzophenone compound, an alkylphenone compound, an acylphosphine oxide compound, a triazine compound, oxime esters, and onium salts. The photopolymerization initiator may be combined with a sensitizer and/or a chain transfer agent, as desired.

The content of the polymerization initiator in the liquid crystal composition is preferably 0.01% to 20% by mass, and more preferably 0.5% to 5% by mass, with respect to the total content of the polymerizable liquid crystal compound and a non-liquid crystalline polymerizable monomer which will be described later.

The polymerization initiators may be used singly or in combination of two or more kinds thereof. In a case where two or more kinds of the polymerization initiators are used, the total content thereof is preferably within the range.

(Non-Liquid Crystalline Polymerizable Monomer)

The liquid crystal composition may include a non-liquid crystalline polymerizable monomer from the viewpoint of the uniformity of a coating film and the strength of a film.

Examples of the non-liquid crystalline polymerizable monomer include radically polymerizable or cationically polymerizable compounds. For example, a radically polymerizable polyfunctional monomer can be used, and the monomer is preferably copolymerizable with the polymerizable group-containing liquid crystal compound. Examples thereof include the monomers described in paragraphs [0018] to [0020] of JP2002-296423A.

Among those, as the non-liquid crystalline polymerizable monomer, (poly)oxyalkylene di(meth)acrylate is preferable, and polyethylene glycol diacrylate is more preferable.

Among the liquid crystal compositions, the content of the non-liquid crystalline polymerizable monomer is preferably 1% to 50% by mass, and more preferably 2% to 30% by mass, with respect to the total mass of the polymerizable liquid crystal compound.

The non-liquid crystalline polymerizable monomers may be used singly or in combination of two or more kinds thereof.

In a case where two or more kinds of the non-liquid crystalline polymerizable monomers are used, the total content thereof is preferably within the range.

(Organic Solvent)

The liquid crystal composition may include an organic solvent. As the organic solvent, a solvent which can completely dissolve the above-mentioned polymerizable liquid crystal compound is preferable, and a solvent which is inert to a polymerization reaction of the polymerizable liquid crystal compound is preferable.

Examples of the organic solvent include alcohol solvents such as methanol, ethanol, ethylene glycol, isopropyl alcohol, propylene glycol, ethylene glycol methyl ether, ethylene glycol butyl ether, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, 2-heptanone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetraethylene glycol dimethyl ether, tetrahydrofuran, and dimethoxyethane; and chlorine-containing solvents such as chloroform and chlorobenzene.

The content of the organic solvent in the liquid crystal composition can be appropriately adjusted from the viewpoints of the solubility of a solid content, a liquid viscosity, the pot life of a coating liquid, the suitability for a coating machine and a coating method, the uniformity of a coating film, control of a film thickness, control of alignment, and the like.

The content of the organic solvent in the liquid crystal composition is, for example, an amount such that the concentration of the solid content of the liquid crystal composition is preferably 13% to 50% by mass, and more preferably 15% to 40% by mass.

The organic solvent may be used singly or in combination of two or more kinds thereof. In a case where two or more kinds of the organic solvents are used, the total content thereof is preferably within the range.

(Other Components)

The liquid crystal composition may include other components, in addition to the above-mentioned components.

As such other components, a surfactant, a chiral agent, or the like may be used from the viewpoint of, for example, adjustment of the alignment of the optically anisotropic layer.

In addition, from the viewpoints of adjustments of the viscosity, the phase transition temperature, and the alignment uniformity of the liquid crystal composition, adjustment of the film properties and the optical characteristics of the optically anisotropic layer, and the like, a sub-liquid crystal compound (non-polymerizable liquid crystal compound) may be used. The sub-liquid crystal compound may be a low molecular liquid crystal compound. Further, the sub-liquid crystal compound may be a main chain type liquid crystal polymer or a side chain type liquid crystal polymer.

From the viewpoint of imparting the liquid crystal composition with a pot life; improving the durability of the optically anisotropic layer; or the like, a polymerization inhibitor, an antioxidant, an ultraviolet absorber, or the like may be used.

From the viewpoint of imparting further functions, adjusting liquid properties, adjusting film properties, or the like, a plasticizer, a retardation control agent, a dichroic coloring agent, a fluorescent coloring agent, a photochromic coloring agent, a thermochromic coloring agent, a photoisomerization material, a photodimerization material, nanoparticles, a thixotropic agent, or the like may also be added.

<Forming Method>

A method for forming an optically anisotropic layer with a liquid crystal composition is not particularly limited, and for example, an optically anisotropic layer can be formed by directly applying a liquid crystal composition onto a support to form a coating film, and subjecting the obtained coating film to an alignment forming treatment such as heating and/or cooling, and a curing treatment (irradiation with ultraviolet rays (light irradiation treatment) or a heating treatment). In addition, the optically anisotropic layer may also be formed by applying a liquid crystal composition onto an alignment film which will be described later and subjecting the film to the same treatment as the above-mentioned treatment.

Application of the liquid crystal composition can be carried out by a known method (for example, a wire bar coating method, an extrusion coating method, a direct gravure coating method, a reverse gravure coating method, and a die coating method).

In the present invention, the thickness of the optically anisotropic layer is not particularly limited, but is preferably 0.1 to 10 µm, and more preferably 0.5 to 5 µm.

<Alignment and Optical Characteristics of Optically Anisotropic Layer>

The optically anisotropic layer can be aligned in various alignment states such as horizontal alignment, vertical alignment, tilt alignment, hybrid alignment, random homogeneous alignment, and cholesteric alignment, and can be imparted with various optical characteristics by appropriately selecting the optical anisotropy and the alignment state of the polymerizable liquid crystal compound.

For example, in a preferred aspect, the optically anisotropic layer may serve as a positive A-plate. The positive A-plate can be obtained by horizontally aligning a rod-like polymerizable liquid crystal compound. Further, in a case where the in-plane retardation Re(550) is set to 100 to 160 nm (preferably 120 to 150 nm), the plate can be suitably used as a positive uniaxial A/4 plate. In addition, by setting Re(550) to be in the range of 250 to 300 nm, the plate can be used as a positive uniaxial/2 plate. Here, Re(550) represents an in-plane retardation at a wavelength of 550 nm of the optically anisotropic layer. The in-plane retardation value can be measured using AxoScan OPMF-1 (manufactured by Opto Science, Inc.).

In another preferred aspect, the optically anisotropic layer may also serve as a positive C-plate. The positive C-plate can be obtained by vertically aligning a rod-like polymerizable liquid crystal compound. The thickness-direction retardation Rth(550) is, for example, 20 to 200 nm, and is preferably 50 to 120 nm from the viewpoint of imparting various optical compensation functions and/or a viewing angle enhancing function, and the like.

In addition, the optically anisotropic layer may be either a negative A-plate or a negative C-plate. Incidentally, by cholesterically aligning the liquid crystal layer, it is also possible to impart the layer with optical rotation, wavelength selective reflectivity, and the like.

Moreover, in the present specification, the A-plate is defined as follows. The A-plate encompasses two kinds of plates, that is, a positive A-plate and a negative A-plate, and in a case where a refractive index in the slow axis direction in the film plane (a direction in which the refractive index becomes a maximum in the plane) is defined as nx, a refractive index in the direction in-plane orthogonal to the in-plane slow axis is defined as ny, and a refractive index in the thickness direction is defined as nz, the positive A-plate satisfies a relationship of Formula (A1) and the negative A-plate satisfies a relationship of Formula (A2). In addition, in the positive A-plate, Rth represents a negative value, and in the negative A-plate, Rth represents a positive value.

$$nx > ny \approx nz \quad \text{Formula (A1)}$$

$$ny < nx \approx nz \quad \text{Formula (A2)}$$

Furthermore, "≈" encompasses a case where the both are completely the same as well as a case where the both are substantially the same as each other. With regard to the expression, "substantially the same", for example, a case where $(ny-nz) \times d$ (in which d is the thickness of a film) is $-10$ to $10$ nm, and preferably $-5$ to $5$ nm is also encompassed by "ny≈nz", and a case where $(nx-nz) \times d$ is $-10$ to $10$ nm, and preferably $-5$ to $5$ nm is also encompassed by "nx≈nz".

The C-plate encompasses two kinds of plates, that is, a positive C-plate and a negative C-plate, the positive C-plate satisfies the relationship of Formula (C1), and the negative C-plate satisfies the relationship of Formula (C2). In addition, in the positive C-plate, Rth represents a negative value, and in the negative C-plate, Rth represents a positive value.

$$nz > nx \approx ny \quad \text{Formula (C1)}$$

$$nz < nx \approx ny \quad \text{Formula (C2)}$$

Furthermore, "≈" encompasses a case where both sides are completely the same as each other as well as a case where the both sides are substantially the same as each other. With regard to the expression, "substantially the same", for example, a case where (nx−ny)×d (in which d is the thickness of a film) is 0 to 10 nm, and preferably 0 to 5 nm is also encompassed by "nx≈ny".

Moreover, it is possible to appropriately adjust the optically anisotropic wavelength dispersion by adjusting the polymerizable liquid crystal compound, the other components used in the liquid crystal composition, and the like.

The optically anisotropic layer preferably exhibits reciprocal wavelength dispersion. As a specific example of the optically anisotropic layer, it is preferable that the optically anisotropic layer satisfies Formula (II) as a uniaxial phase difference layer.

$$\Delta n(450)/n(550) < 1.00 \quad (II)$$

Here, in Formula (II), Δn(450) represents a refractive index difference between the refractive index in the direction such that the refractive index is maximum at a wavelength of 450 nm of the optically anisotropic layer and the refractive index in a direction orthogonal thereto, and Δn(550) represents a refractive index difference between the refractive index in the direction such that the refractive index is maximum at a wavelength of 550 nm of the optically anisotropic layer and the refractive index in a direction orthogonal thereto.

[Support]

The liquid crystal film of the embodiment of the present invention has a support as described above. The support is not particularly limited and various known materials can be used. Among those, a long polymer film is preferable from the viewpoint that it enables continuous production.

Examples of the polymer film include polymer films obtained by forming polyolefin•cyclic olefin-based resins such as polypropylene and a norbornene-based polymer; polyvinyl alcohols; polyester resins such as polyethylene terephthalate, polybutylene terephthalate, and polyethylene naphthalate; polymethacrylic acid esters•polyacrylic acid esters such as polymethyl methacrylate; cellulose esters such as triacetyl cellulose, diacetyl cellulose, and cellulose acetate propionate; polyethylene naphthalate; polycarbonates; or a copolymer thereof into films. These polymer films can be appropriately selected on the basis of the viewpoints of a tensile modulus, a flexural modulus, a parallel light transmittance, a haze, optical anisotropy, optical isotropy, easy peelability, easy adhesion, and the like.

In the present invention, from the viewpoint of obtaining an optically anisotropic layer having uniform alignment, the coating-side surface of the support is preferably smooth and the surface roughness Ra is preferably 3 to 50 nm in a case of forming an optically anisotropic layer by directly applying a liquid crystal composition onto a support.

In addition, in a case where an alignment layer which will be described later is provided on a support and a liquid crystal composition is applied onto the alignment layer to form an optically anisotropic layer, the surface of the alignment layer only needs to be smooth and the surface roughness Ra is preferably 3 to 50 nm. It is also possible that an intermediate layer which will be described later, or the like is provided and a surface roughness thereof is adjusted.

Moreover, in use of the long polymer film, from the viewpoint of preventing a phenomenon of shape transfer and blocking between the film surfaces in the state of a wound body formed by winding a liquid crystal film produced, a surface on the opposite side to a surface of the support, on which the liquid crystal composition is applied, can be subjected to an anti-blocking treatment, a mat treatment, or the like. In addition, knurling may be provided on an end of the film.

Moreover, it is also preferable that the support is provided so as to be peeled. That is, it is also preferable that the support is peelably disposed from an adjacent layer in the liquid crystal film. Here, in a case where an optically anisotropic layer is directly arranged on the support, it is preferable that peeling can occur at the interface between the support and the optically anisotropic layer. Further, in a case where an alignment layer which will be described later and/or the other layers (intermediate layer) are arranged between the support and the optically anisotropic layer, it is preferable that peeling can occur at any interface between the support and the optically anisotropic layer or within the layer.

[Alignment Layer]

The liquid crystal film of the embodiment of the present invention may have an alignment layer, as desired. From the viewpoint that an optically anisotropic layer having more excellent alignment is easily obtained, it is preferable that an alignment layer is provided on a support and the above-mentioned optically anisotropic layer is further provided on the alignment layer. That is, it is preferable that the liquid crystal film of the embodiment of the present invention has a photo-alignment layer between the support and the optically anisotropic layer.

Various known alignment layers can be used as the alignment layer, and examples thereof include a rubbing film (rubbing alignment film) formed of an organic compound such as a polymer), an oblique deposition film from an inorganic compound, a film having microgrooves, and a film formed by accumulating a Langmuir-Blodgett film (LB film) formed with an organic compound (for example, ω-trichosanic acid, dioctadecylmethylammonium chloride, and methyl stearate) by a Langmuir-Blodgett method.

From the viewpoint of preventing alignment defects caused by foreign matters, a photo-alignment layer formed of a photo-alignment film is also preferable as the alignment layer.

Examples of the rubbing alignment film include a coating film formed of polyimide, polyvinyl alcohol, the polymer having a polymerizable group described in JP1997-152509A (JP-H09-152509A), or the like, and the alignment films described in JP2005-097377A, JP2005-099228A, and JP2005-128503A.

A composition for forming a photo-alignment film used for formation of a photo-alignment film which can be used in the present invention is described in a number of documents, and the like. For example, the materials using azo compounds described in WO08/056597A, JP2008-076839A, and JP2009-109831A; the photo-alignment polyorganosiloxane composite materials described in JP2012-155308A, JP2014-026261A, JP2014-123091A, and JP2015-026050A; the cinnamic acid group-containing cellulose ester materials described in JP2012-234146A; the materials using an optical Fries rearrangement reaction or its analogous reaction described in JP2012-145660A and JP2013-238717A; the photodimerizable compounds (for example, materials in which a cinnamate compound, a chalcone compound, and/or a coumarin compound are pendant on various polymers) described in JP2016-071286A, JP2013-518296A, JP2014-533376A, JP2016-535158A, WO10/150748A, WO11/126022A, WO13/054784A, WO14/104320A, and WO16/002722A; or the like can be used in the composition for forming a photo-alignment film.

Among those, from the viewpoint of irradiation energy, alignment regulating force, and the like required for photo-alignment, a photo-alignment film using the photoisomerization reaction of an azo group or a photo-alignment film using the photoreaction reaction of a cinnamate compound is preferable.

A crosslinking agent, a binder, a plasticizer, a sensitizer, a crosslinking catalyst, an adhesion modifier, a leveling agent, or the like may be added to a composition for forming an alignment film (preferably a composition for forming a photo-alignment film) used for formation of an alignment film, as desired.

The film thickness of the alignment layer is not particularly limited, can be appropriately selected depending on purposes, and is, for example, preferably 10 to 1,000 nm, and more preferably 10 to 300 nm. The surface roughness of the alignment layer is the same as described above.

[Other Layers (Intermediate Layer)]

The liquid crystal film of the embodiment of the present invention can further include other layers, as desired. Examples of the layer include a smoothing layer, an easily adhesive layer, an easily peelable layer, a light-blocking layer, a colored layer, a fluorescent layer, an oxygen barrier layer, and a water vapor barrier layer. Layers having one or more of the functions of such layers are collectively referred to as an intermediate layer. The intermediate layer may be a layer having a function other than the functions as described above.

Various functions can be expressed by providing the intermediate layer, for example, between the support and the optically anisotropic layer and/or between the support and the above-mentioned alignment layer, or the like.

[Production Method]

The liquid crystal film of the embodiment of the present invention can be manufactured by, for example, sequentially laminating and applying compositions for forming the respective layers (a liquid crystal composition and the like) onto a support.

Preferred aspects of the method include an aspect including the following steps (1) to (4) in this order.

(1) A step of applying a composition forming an alignment film onto a support to obtain a coating film (coating step)

(2) A step of subjecting the coating film to a rubbing treatment or a photo-alignment treatment to impart the coating film with an alignment regulating force, thereby forming the coating film into an alignment layer (alignment regulating force imparting step)

(3) A step of applying a liquid crystal composition onto the alignment layer (4) A step of aligning the polymerizable liquid crystal compound and then fixing the alignment state In addition, the process after the step (3) is the same as described above in the method for forming an optically anisotropic layer.

<Applying Step>

An applying method in the applying step is not particularly limited, and can be appropriately selected depending on the purposes, and examples of the method include spin coating, die coating, gravure coating, flexographic coating, and ink jet printing. It is preferable that a solvent removing step (drying step) is included after application of the composition forming an alignment film, and a post-baking step can further be included.

<Alignment Regulating Force Imparting Step>

An alignment regulating force imparting step is a step of subjecting the coating film formed with the composition forming an alignment film to a rubbing treatment, a light irradiation treatment, or the like. The rubbing treatment can be performed by a method known in the related art.

For the light irradiation treatment to which the coating film formed with the composition for forming a photo-alignment film is subjected, it is preferable to perform irradiation with polarized light. The polarized light is not particularly limited, examples thereof include linearly polarized light, circularly polarized light, and elliptically polarized light, and among these, the linearly polarized light is preferable. From the viewpoint of forming a liquid crystal layer which is horizontally aligned, it is preferable to perform irradiation with polarized light from the vertical direction, and from the viewpoint of imparting tilt alignment or a tilt, it is preferable to perform irradiation with polarized light from the oblique direction.

The wavelength with regard to polarized light or non-polarized light is not particularly limited as long as it can impart a coating film formed with the composition for forming a photo-alignment film with an alignment control ability on a polymerizable liquid crystal compound or the like. Examples of the light used include ultraviolet rays, near-ultraviolet rays, and visible light. Among those, near-ultraviolet rays at 250 to 450 nm are preferable.

Furthermore, examples of a light source for irradiation with polarized light or non-polarized light include a xenon lamp, a high-pressure mercury lamp, an ultra-high-pressure mercury lamp, a metal halide lamp, a laser, and a light emitting diode (LED). A wavelength range for irradiation can be limited by using an interference filter, a color filter, or the like with respect to ultraviolet rays or visible light obtained from the light source, as desired. In addition, linearly polarized light can be obtained by using a polarizing filter, a polarizing prism, or the like with respect to light from these light sources.

An integrated amount of the polarized light or non-polarized light is not particularly limited as long as it can impart the coating film from the composition for forming a photo-alignment film with an alignment control ability on the polymerizable liquid crystal compound, and is, for example, preferably 1 to 300 $mJ/cm^2$, and more preferably 3 to 100 $mJ/cm^2$.

An illuminance of the polarized light or non-polarized light is not particularly limited as long as it can impart the coating film from the composition for forming a photo-alignment film with an alignment control ability on the liquid crystal compound, and is, for example, preferably 0.1 to 300 $mW/cm^2$, and more preferably 1 to 100 $mW/cm^2$.

[Optical Laminate]

The optical laminate of the embodiment of the present invention is an optical laminate having an optically anisotropic layer formed of the above-mentioned liquid crystal composition, an adhesive, and an optically functional layer, in which the optically anisotropic layer and the optically functional layer are adhered to each other through an adhesive layer.

Figure 4:
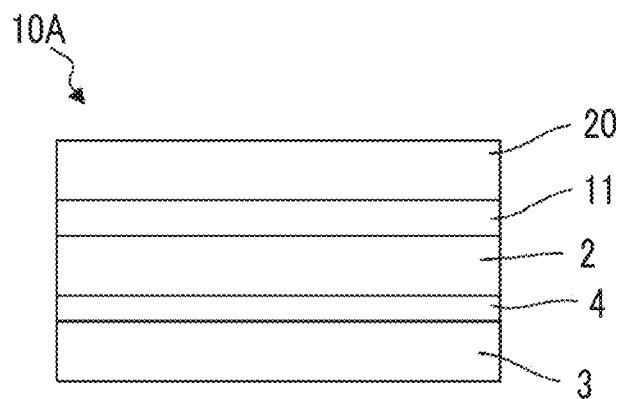
FIG. 4 is a schematic cross-sectional view showing an example of the optical laminate of an embodiment of the present invention.

For example, the optical laminate of the embodiment of the present invention is schematically shown in FIG. 4. The optical laminate 10A of FIG. 4 has a support 3, an alignment layer 4, an optically anisotropic layer 2, an adhesive layer 11, and an optically functional layer 20, which are laminated in this order. Among those, the support 3, the alignment layer 4, and the optically anisotropic layer 2 correspond to the above-mentioned liquid crystal film, which is constructed to be as follows: a surface serving as the air interface side of the optically anisotropic layer 2 included in the liquid crystal film is adhered to the optically functional layer 20 (adherend) through the adhesive layer 11.

In the optical laminate of the embodiment of the present invention, the optically functional layer may further be adhered to another layer (for example, another optically functional layer).

In addition, in the optical laminate of the embodiment of the present invention, a surface which is not on the air interface side of the optically anisotropic layer may further be adhered to another layer (for example, a support or another optically functional layer).

In the state where the optically anisotropic layer is adhered to the optically functional layer, a support constituting the liquid crystal film of the embodiment of the present invention may be peeled and removed, as desired.

With regard to peeling and removal of the support, in a case where the optically anisotropic layer is directly provided on the support, the peeling can be performed at an interface between the support and the optically anisotropic layer. Further, in a case where an alignment layer and/or the other layer (intermediate layer) is provided between the support and the optically anisotropic layer, the peeling may be carried out at any interface between the support and the optically anisotropic layer or within the layer.

Figure 5:
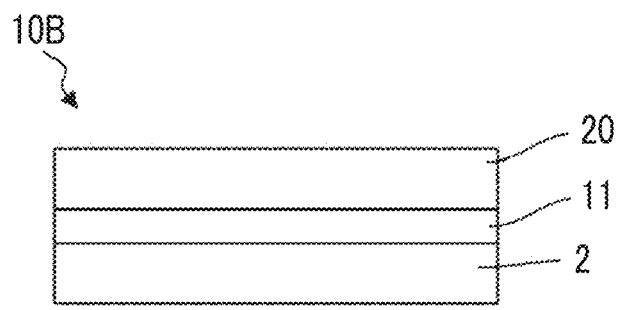
FIG. 5 is a schematic cross-sectional view showing an example of the optical laminate of the embodiment of the present invention.

The optical laminate from which such the support has been removed is schematically shown in FIG. 5, for example. An optical laminate 10B in FIG. 5 has an optically anisotropic layer 2, an adhesive layer 11, and an optically functional layer 20 which are laminated in this order. In this optical laminate, the optically anisotropic layer 2 and the optically functional layer 20 may be adhered to each other through an adhesive layer 11.

The optical laminate in FIG. 5 may be obtained by peeling the support 3 and the alignment layer 4 from the optical laminate in FIG. 4.

[Optically Functional Layer]

As the optically functional layer, layers having various functions, such as a polarizer, an optically isotropic layer, a phase difference layer, an optical rotation layer, a reflection layer, a scattering layer, a colored layer, and a fluorescent layer, can be used.

One optically functional layer may have a plurality of functions in the above-mentioned layers. Further, one optically functional layer may be formed of a plurality of layers. One or more of the plurality of the layers constituting the optically functional layer may be a layer not having an optical function.

For example, the optically functional layer is preferably a polarizer or a phase difference layer.

In addition, the optically functional layer is also preferably a liquid crystal layer. Further, the liquid crystal layer used as the optically functional layer may be formed with the above-mentioned liquid crystal composition and may also be formed with the other compositions. Such a liquid crystal layer can be used as, for example, a phase difference layer.

<Polarizer>

The polarizer is not particularly limited as long as it is a member having a function to convert light to specific polarized light, and examples thereof include an absorption type polarizer and a reflection type polarizer, known in the related art.

Examples of the absorption type linear polarizer include an iodine-based polarizer, a dye-based polarizer using a dichroic dye, and a polyene-based polarizer. To the iodine-based polarizer and the dye-based polarizer, both of a coating type polarizer and a stretched polarizer can be applied. From the viewpoint of excellent versatility, a polarizer manufactured by allowing iodine or a dichroic dye adsorbed onto polyvinyl alcohol and performing stretching is preferable.

Examples of the reflection type polarizer include reflective linear polarizers such as a polarizer obtained by laminating films having different birefringences and a wire grid type polarizer, and reflection type circular polarizers including a cholesteric liquid crystal having a selective reflection range.

The thickness of the polarizer is not particularly limited, but is preferably 1 to 60 µm, more preferably 1 to 30 µm, and still more preferably 2 to 20 µm.

Furthermore, in addition to the arrangement of the polarizer as an optically functional layer to be adhered onto a surface which has been the air interface side of an optically anisotropic layer through an adhesive layer, an arrangement of the polarizer directly or through another layer (an adhesive layer or the like) onto a surface on the opposite side to the surface which has been the air-side interface of the optically anisotropic layer is also preferable.

<Phase Difference Layer>

A phase difference layer to be used as the optically functional layer is not particularly limited and various known phase difference layers can be used. For example, a layer (liquid crystal layer) formed with a composition including a polymer film, a stretched alignment film thereof, and a liquid crystal compound, and a layer obtained by aligning inorganic materials can be used without limitation.

In addition, the liquid crystal film or the optically anisotropic layer thereof disclosed in the present invention can be used as a phase difference layer (optically functional layer). That is, the liquid crystal films of the embodiment of the present invention or optically anisotropic layers thereof can be combined in plural numbers to form an optical laminate.

[Adhesive Layer]

In the optical laminate of the embodiment of the present invention, an adhesive layer is used to make a surface on the air interface side of the optically anisotropic layer of the liquid crystal film of the embodiment of the present invention adhered to the optically functional layer. As an adhesive for forming an adhesive layer, various known materials can be used, and examples thereof include a pressure sensitive adhesive, a hot-melt type adhesive, a thermosetting adhesive, a photocurable adhesive, a humidity-curable adhesive, and a dried/solidified adhesive.

Among those, the adhesive layer is preferably a layer formed by curing a photocurable adhesive from the viewpoints that the thickness of the adhesive layer can be reduced, curing can be rapidly performed, all the physical properties after curing can be excellent, and the like. Examples of the photocurable adhesive include an ultraviolet-curable adhesive (UV adhesive).

Examples of the photocurable adhesive include a radical polymerization type photocurable adhesive (for example, an acrylic adhesive) and a cation polymerization type photocurable adhesive (for example, an epoxy-based adhesive). In addition, the adhesive is preferably a solvent-free adhesive from the viewpoint that the effect on the optically functional layer is reduced.

In a method for forming the adhesive layer, for example, an adhesive may be applied onto the air interface side of an optically anisotropic layer, and then the applied adhesive and an optically functional layer may be brought into contact and adhered to each other. Alternatively, an adhesive may be applied onto an optically functional layer and then the applied adhesive and the optically anisotropic layer may be brought into contact and adhered to each other.

Before being brought into contact with the adhesive, the air interface side of the optically anisotropic layer can be subjected to an easy adhesion treatment. Examples of the easy adhesion treatment include an actinic energy ray irradiation treatment, a plasma treatment, a corona treatment, and a deposition treatment. The plasma treatment or the corona treatment is preferable from the viewpoint that an effect on the optical characteristics of the optically anisotropic layer can be minimized by treating only the surface.

[Function of Optical Laminate]

The optical laminate of the embodiment of the present invention can be applied to various applications by the optically functional layer to be used.

For example, a polarizing plate for a liquid crystal display device having an optical compensation function can be constructed by incorporation of at least a polymer film, an absorption type linear polarizer, an adhesive layer, and an optically anisotropic layer in this order. In this case, the optically anisotropic layer may be imparted with appropriate optical anisotropy in conjunction with the type of a liquid crystal display device to be applied. The polymer film may have an anti-glare layer, an antireflection layer, a brightness enhancing layer, or the like. In order to adjust light leakage and a tint in the diagonal view direction, other phase difference layers may be combined therewith.

For example, in a case of using the optical laminate of the embodiment of the present invention, a circularly polarizing plate having the optical laminate of the embodiment of the present invention can be manufactured. Further, the circularly polarizing plate may partly include the optical laminate of the embodiment of the present invention or may be the optical laminate of the embodiment of the present invention itself.

Figure 6:
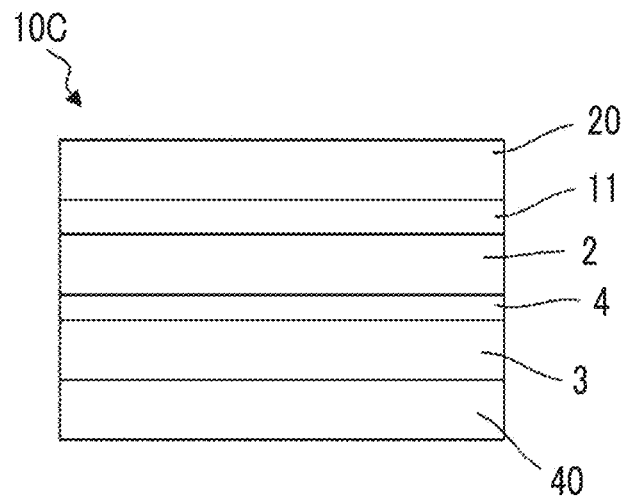
FIG. 6 is a schematic cross-sectional view showing an example of the circularly polarizing plate of an embodiment of the present invention.

Such a circularly polarizing plate is schematically shown in FIG. 6. A circularly polarizing plate 10C shown in FIG. 6 has a polymer film (not shown), a polarizer 40 (preferably a linear absorption type polarizer) which is a linear polarizer, a support 3, an alignment layer 4, an optically anisotropic layer 2, an adhesive layer 11, and an optically functional layer 20 in this order.

In a case where the circularly polarizing plate in FIG. 6 has at least the polarizer 40 which is a linear polarizer, the optically anisotropic layer 2, the adhesive layer 11, and the optically functional layer 20 in this order, the other layers may be omitted.

In the circularly polarizing plate in FIG. 6, the optically anisotropic layer preferably functions as a λ/4 plate.

In the circularly polarizing plate in FIG. 6, it is possible to suppress light leakage in the diagonal view direction by forming the optically functional layer 20 into a positive C-plate.

In addition, an optical laminate having at least the optically anisotropic layer 2, the adhesive layer 11, and the polarizer 40 which is a linear polarizer in this order may be used as a circularly polarizing plate. In this case, it is preferable that a positive C-plate is arranged on a surface on the opposite side of the surface of the optically anisotropic layer 2, on which the adhesive layer 11 is present.

The circularly polarizing plate can be incorporated into an organic EL display device to improve the display quality.

Moreover, a wide-band λ/4 plate can be constructed by combining λ/4 plate and a λ/2 plate. In this case, it is preferable that at least one of the λ/4 plate or the λ/2 plate is the liquid crystal film of the embodiment of the present invention or an optically anisotropic layer thereof. It is also preferable that all of the positive C-plate, the λ/4 plate, and the λ/2 plate as described above serve as the liquid crystal film of the embodiment of the present invention or an optically anisotropic layer thereof, from the viewpoint that an optical laminate having excellent adhesion between the layers is obtained.

Other examples of the applications of the optical laminate of the embodiment of the present invention include a brightness enhancing plate, a reflection polarizing plate, a wavelength-selective reflection element, a reflection-reducing layer, a patterned retarder, a collimation element, an authenticity verification seal, a hologram element, a designable member, and a decorative material.

[Image Display Device]

The optical laminate of the embodiment of the present invention can be applied to an image display device.

A display device used in the image display element is not particularly limited, and examples thereof include a liquid crystal cell, an organic EL display element, and a plasma display panel. The optical laminate of the embodiment of the present invention can be used for optical compensation for improving a display quality, and can also be used to suppress a decrease in the display quality due to reflection of external light by the display element.

[Liquid Crystal Display Device]

A liquid crystal display device which is an example of the image display device is a liquid crystal display device having the above-mentioned optical laminate of the embodiment of the present invention and a liquid crystal cell. Examples of the liquid crystal cell include a vertical alignment (VA) mode, an optical compensated bend (OCB) mode, an in-plane-switching (IPS) mode, or a twisted nematic (TN) mode. Incidentally, other modes may also be adopted. By applying and combining the optical laminate of the embodiment of the present invention into an optical compensation configuration and a brightness enhancement configuration adapted to the liquid crystal cell, it is possible to realize excellent wide viewing angle characteristics, prevention of light leakage in a black display, and a high-brightness display.

[Organic EL Display Device]

It is also preferable that the organic EL display device has the above-mentioned circularly polarizing plate. In this case, the circularly polarizing plate preferably functions as an antireflection plate.

Figure 7:
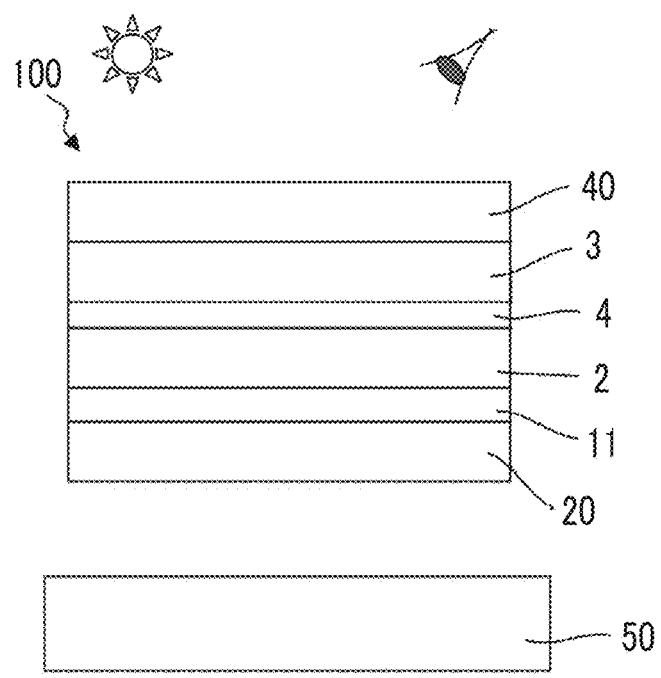
FIG. 7 is a schematic cross-sectional view showing an example of the organic electroluminescent (EL) display device of an embodiment of the present invention.

Such an organic EL display device is schematically shown in FIG. 7, for example. An organic EL display device 100 shown in FIG. 7 has an organic EL display element 50, an optically functional layer 20, an adhesive layer 11, an optically anisotropic layer 2, an alignment layer 4, a support 3, and a polarizer 40 which is a linear polarizer (preferably an absorption type linear polarizer) in this order.

In the organic EL display device 100 in FIG. 7, the optically functional layer 20, the adhesive layer 11, the optically anisotropic layer 2, the alignment layer 4, the support 3, and the polarizer 40 correspond to the circularly polarizing plate shown in FIG. 6.

In a case where the organic EL display device has the configuration as described above, it is possible to suppress a phenomenon that external light is reflected on an electrode and the like of the organic EL display element to lower a display contrast, thereby obtaining a high-quality display, upon observation of the organic EL display device 100 from the polarizer 40 side.

As the organic EL display element, known configurations can be widely used. In addition, the organic EL display device may further comprise a touch panel.

EXAMPLES

Hereinafter, the present invention will be described in more detail with reference to Examples. The materials, the amounts of materials used, the proportions, the treatment details, the treatment procedure, and the like shown in Examples below may be appropriately modified as long as the modifications do not depart from the spirit of the present invention. Therefore, the scope of the present invention should not be construed as being limited to Examples shown below.

Examples 1 to 4 and Comparative Examples 1 and 2

[Preparation of Composition for Forming Photo-Alignment Film]

The materials for forming a photo-alignment film described in Example 1 of WO2016/002722A were prepared and used in the production of the liquid crystal film of the embodiment of the present invention.

[Preparation of Liquid Crystal Composition]

A liquid crystal composition having the following composition was prepared. Further, among the leveling agents used in the liquid crystal composition, FA-1 and FA-2 are each a fluoroaliphatic group-containing copolymer having a repeating unit derived from the fluoroaliphatic group-containing monomer represented by General Formula (1) and a repeating unit having a polymerizable group polymerizable with the polymerizable liquid crystal compound.

| Liquid crystal composition 1 | |
|---|---|
| The following polymerizable liquid crystal compound L-3 | 42.00 parts by mass |
| The following polymerizable liquid crystal compound L-4 | 42.00 parts by mass |
| The following polymerizable liquid crystal compound A-1 | 16.00 parts by mass |
| The following polymerization initiator S-1 (oxime esters) | 0.50 parts by mass |
| The following leveling agent FA-1 | 0.15 parts by mass |
| HISOLVE MTEM (manufactured by TOHO Chemical Industry Co., Ltd.) | 2.00 parts by mass |
| NKester A-200 (manufactured by Shin Nakamura Chemical Co., Ltd.) | 1.00 part by mass |
| Methyl ethyl ketone | 424.8 parts by mass |

In addition, a group adjacent to each of the acryloyloxy groups of the following polymerizable liquid crystal compounds L-3 and L-4 represents a propylene group (a group in which a methyl group is substituted with an ethylene group), and the following polymerizable liquid crystal compounds L-3 and L-4 each represent a mixture of position isomers having different positions of the methyl groups.

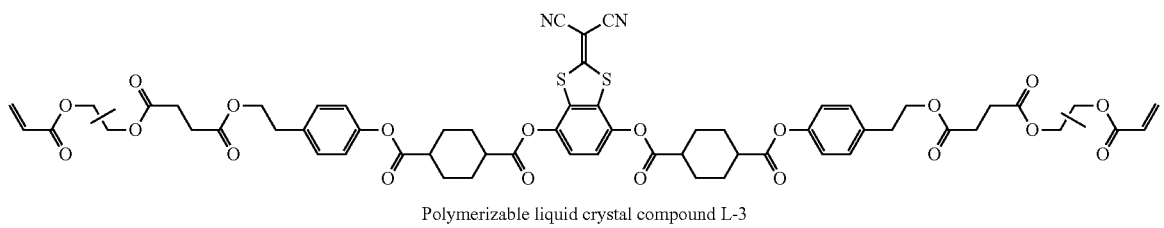

Polymerizable liquid crystal compound L-3

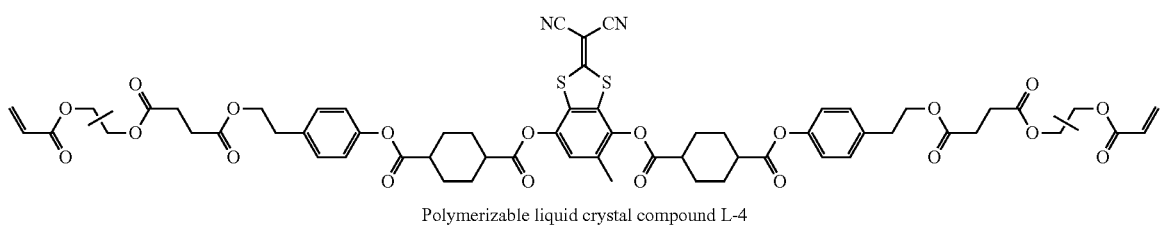

Polymerizable liquid crystal compound L-4

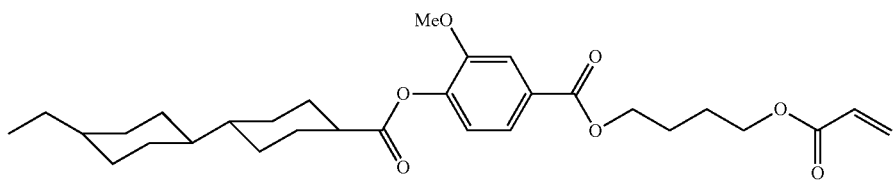

Polymerizable liquid crystal compound A-1

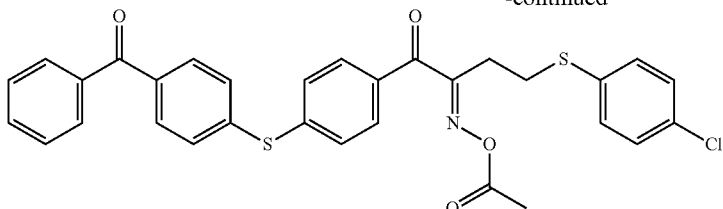

Polymerization initiator S-1

Leveling agent FA-1

In the resin represented by the following structural formula, a to c are values satisfying a:b:c=60:30:10 and represent the contents (% by mole) of the respective repeating units with respect to all the repeating units in the resin.

In addition, the weight-average molecular weight was 25,800 and the dispersity was 2.90.

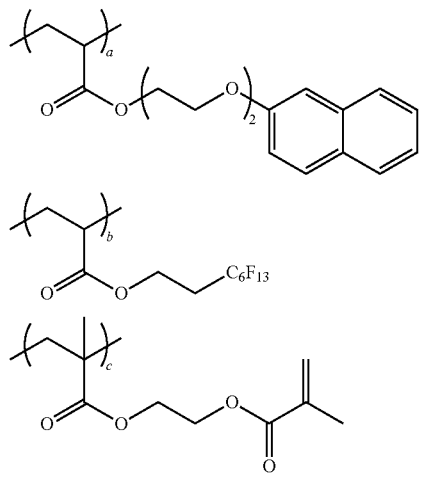

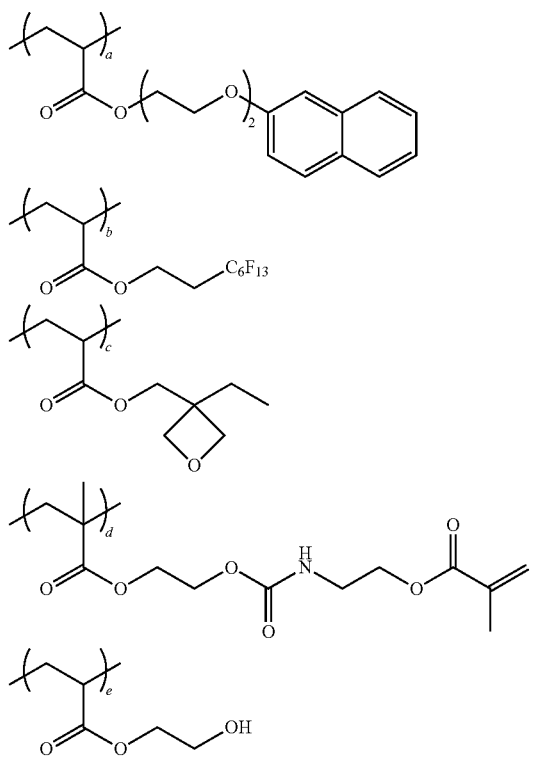

| Liquid crystal composition 2 | |
|---|---|
| Polymerizable liquid crystal compound L-3 | 42.00 parts by mass |
| Polymerizable liquid crystal compound L-4 | 42.00 parts by mass |
| Polymerizable liquid crystal compound A-1 | 16.00 parts by mass |
| Polymerization initiator S-1 (oxime esters) | 0.50 parts by mass |
| The following leveling agent FA-2 | 0.15 parts by mass |
| HISOLVE MTEM (manufactured by TOHO Chemical Industry Co., Ltd.) | 2.00 parts by mass |
| NKester A-200 (manufactured by Shin Nakamura Chemical Co., Ltd.) | 1.00 part by mass |
| Methyl ethyl ketone | 424.8 parts by mass |

| Liquid crystal composition 3 | |
|---|---|
| Polymerizable liquid crystal compound L-3 | 42.00 parts by mass |
| Polymerizable liquid crystal compound L-4 | 42.00 parts by mass |
| Polymerizable liquid crystal compound A-1 | 16.00 parts by mass |
| Polymerization initiator S-1 (oxime esters) | 0.50 parts by mass |
| Leveling agent FA-1 | 0.10 parts by mass |
| HISOLVE MTEM (manufactured by TOHO Chemical Industry Co., Ltd.) | 2.00 parts by mass |
| NKester A-200 (manufactured by Shin Nakamura Chemical Co., Ltd.) | 1.00 part by mass |
| Methyl ethyl ketone | 424.8 parts by mass |

Leveling agent FA-2

In the resin represented by the following structural formula, a to e are values satisfying a:b:c:d:e=53:25:10:10:2 and represent the contents (% by mole) of the respective repeating units with respect to all the repeating units in the resin.

In addition, the weight-average molecular weight was 59,600 and the dispersity was 2.91.

| Liquid crystal composition 4 | |
|---|---|
| Polymerizable liquid crystal compound L-3 | 42.00 parts by mass |
| Polymerizable liquid crystal compound L-4 | 42.00 parts by mass |
| Polymerizable liquid crystal compound A-1 | 16.00 parts by mass |
| Polymerization initiator S-1 (oxime esters) | 0.50 parts by mass |
| The following leveling agent FA-1 | 0.20 parts by mass |
| HISOLVE MTEM (manufactured by TOHO Chemical Industry Co., Ltd.) | 2.00 parts by mass |

-continued

| Liquid crystal composition 4 | |
|---|---|
| NKester A-200 (manufactured by Shin Nakamura Chemical Co., Ltd.) | 1.00 part by mass |
| Methyl ethyl ketone | 424.8 parts by mass |

| Liquid crystal composition 5 | |
|---|---|
| Polymerizable liquid crystal compound L-3 | 42.00 parts by mass |
| Polymerizable liquid crystal compound L-4 | 42.00 parts by mass |
| Polymerizable liquid crystal compound A-1 | 16.00 parts by mass |
| Polymerization initiator S-1 (oxime esters) | 0.50 parts by mass |
| The following leveling agent FB-1 | 0.15 parts by mass |
| HISOLVE MTEM (manufactured by TOHO Chemical Industry Co., Ltd.) | 2.00 parts by mass |
| NKester A-200 (manufactured by Shin Nakamura Chemical Co., Ltd.) | 1.00 part by mass |
| Methyl ethyl ketone | 424.8 parts by mass |

Leveling Agent FB-1

In the resin represented by the following structural formula, a and b are values satisfying a:b=75:25 and represent the contents (% by mole) of the respective repeating units with respect to all the repeating units in the resin.

In addition, the weight-average molecular weight was 27,200 and the dispersity was 2.75.

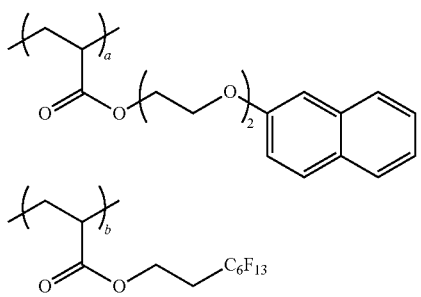

| Liquid crystal composition 6 | |
|---|---|
| Polymerizable liquid crystal compound L-3 | 42.00 parts by mass |
| Polymerizable liquid crystal compound L-4 | 42.00 parts by mass |
| Polymerizable liquid crystal compound A-1 | 16.00 parts by mass |
| Polymerization initiator S-1 (oxime type) | 0.50 parts by mass |
| The following leveling agent FC-1 | 0.15 parts by mass |
| HISOLVE MTEM (manufactured by TOHO Chemical Industry Co., Ltd.) | 2.00 parts by mass |
| NKester A-200 (manufactured by Shin Nakamura Chemical Co., Ltd.) | 1.00 part by mass |
| Methyl ethyl ketone | 424.8 parts by mass |

Leveling Agent FC-1

In the resin represented by the following structural formula, a and b are values satisfying a:b=90:10 and represent the contents (% by mole) of the respective repeating units with respect to all the repeating units in the resin.

In addition, the weight-average molecular weight was 21,000 and the dispersity was 2.70.

| Liquid crystal composition 7 | |
|---|---|
| Polymerizable liquid crystal compound L-3 | 42.00 parts by mass |
| Polymerizable liquid crystal compound L-4 | 42.00 parts by mass |
| Polymerizable liquid crystal compound A-1 | 16.00 parts by mass |
| Polymerization initiator S-1 (oxime esters) | 0.50 parts by mass |
| The following leveling agent FD-1 | 0.15 parts by mass |
| HISOLVE MTEM (manufactured by TOHO Chemical Industry Co., Ltd.) | 2.00 parts by mass |
| NKester A-200 (manufactured by Shin Nakamura Chemical Co., Ltd.) | 1.00 part by mass |
| Methyl ethyl ketone | 424.8 parts by mass |

Leveling Agent FD-1

In the resin represented by the following structural formula, a to c are values satisfying a:b:c=60:30:10 and represent the contents (% by mole) of the respective repeating units with respect to all the repeating units in the resin.

In addition, the weight-average molecular weight was 23,800 and the dispersity was 2.80.

[Manufacture of Cellulose Acylate Film 1]

(Manufacture of Core Layer Cellulose Acylate Dope)

The following composition was introduced into a mixing tank and stirred to dissolve the respective components to prepare a cellulose acetate solution for use as a core layer cellulose acylate dope.

| Core layer cellulose acylate dope | |
|---|---|
| Cellulose acetate having degree of substitution with acetyl of 2.88 | 100 parts by mass |
| Polyester compound B described in Examples of JP2015-227955A | 12 parts by mass |
| The following compound G | 2 parts by mass |
| Methylene chloride (first solvent) | 430 parts by mass |
| Methanol (second solvent) | 64 parts by mass |

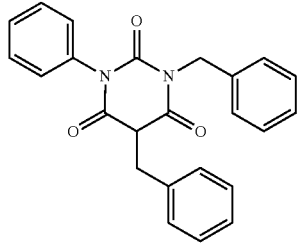

Compound G (Manufacture of Outer Layer Cellulose Acylate Dope)

10 parts by mass of the following matting solution was added to 90 parts by mass of the core layer cellulose acylate dope to prepare a cellulose acetate solution for use as an outer layer cellulose acylate dope.

| Matting solution | |
|---|---|
| Silica particles having average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| Core layer cellulose acylate dope above | 1 part by mass |

(Manufacture of Cellulose Acylate Film 1)

The core layer cellulose acylate dope and the outer layer cellulose acylate dope were filtered through a filter paper having an average pore diameter of 34 μm and a sintered metal filter having an average pore diameter of 10 μm, and then all the three layers of the core layer cellulose acylate dope and the outer layer cellulose acylate dopes on both sides thereof were simultaneously cast on a drum at 20° C. from a casting port (band casting machine). Peeling was performed in the state where the solvent content was approximately 20% by mass, and the both ends of the film in the width direction were fixed with a tenter clip and dried while stretching the film at a stretch ratio of 1.1 times in the transverse direction. Thereafter, the obtained film was transported between rolls of a heat treatment device and further dried to manufacture an optical film having a thickness of 40 μm, which was taken as a cellulose acylate film 1. In the obtained cellulose acylate film 1, the thickness of the core layer was 36 μm and the thickness of each of the outer layers arranged on the both sides of the core layer was 2 μm. The in-plane retardation of the obtained cellulose acylate film 1 at a wavelength of 550 nm was 0 nm. The obtained cellulose acylate film 1 was taken as a support.

[Manufacture of Liquid Crystal Film]

The composition for forming a photo-alignment film prepared above was applied onto a surface of one side of the manufactured cellulose acylate film 1 with a bar coater.

After applying the composition for forming a photo-alignment film, the obtained film was dried for 1 minute on a hot plate at 120° C. to remove the solvent, thereby forming a composition layer for forming a photo-alignment film having a thickness of 0.3 μm.

The obtained composition layer for forming a photo-alignment film was irradiated with polarized ultraviolet rays (10 mJ/cm$^2$, an ultra-high pressure mercury lamp was used), thereby forming a photo-alignment layer.

Subsequently, the liquid crystal compositions 1 to 7 prepared above were each applied onto the photo-alignment layer with a bar coater, thereby forming a liquid crystal composition layer.

The formed liquid crystal composition layer was once heated to 110° C. on a hot plate and then cooled to 60° C. to stabilize the alignment.

Thereafter, the liquid crystal composition layer was kept at 60° C. and irradiated with ultraviolet rays (500 mJ/cm$^2$, an ultra-high pressure mercury lamp was used) in a nitrogen atmosphere (an oxygen concentration of 100 ppm) to fix the alignment, thereby forming an optically anisotropic layer having a thickness of 2.3 μm, from which a liquid crystal film was manufactured. The in-plane retardation of the obtained liquid crystal film at a wavelength of 550 nm was 140 nm.

<Evaluation of Alignment>

The manufactured liquid crystal film was observed in the state of being 2° shifted from an extinction level with a polarizing microscope. A state where a partial difference in brightness upon observation did not exist was evaluated as a case where the liquid crystal director is uniformly aligned (excellent alignment).

The results of observation were classified in light of the following standard. The results are shown in Table 1 below.

AAA: The liquid crystal director is finely arranged and aligned, and the display performance is very excellent.

AA: The liquid crystal director is uniformly arranged and aligned, and the display performance is excellent.

A: There is no disturbance of the liquid crystal director and the surface state is stable.

B: Disturbance of the liquid crystal director is negligible and the surface state is stable.

C: Disturbance of the liquid crystal director is partial and the surface state is stable.

D: The liquid crystal director is significantly disturbed, the surface state is not stable, and thus, the display performance is much deteriorated.

[Manufacture of Antireflection Plate (Circularly Polarizing Plate) for Organic EL]

(Manufacture of Positive C-Plate Film 1)

A commercially available triacetyl cellulose film "Z-TAC" (manufactured by FUJIFILM Corporation) was used as a temporary support (the film was taken as a cellulose acylate film 2). The cellulose acylate film 2 was passed through dielectric heating rolls at a temperature of 60° C. to raise the film surface temperature to 40° C., and then an alkaline solution having the composition shown below was applied onto one surface of the film at a coating amount of 14 ml/m$^2$ with a bar coater, heated to 110° C., and transported for 10 seconds under a steam-type far-infrared heater manufactured by Noritake Co., Ltd. Subsequently, 3 ml/m$^2$ of pure water was similarly applied onto the obtained film with the same bar coater. Subsequently, washing with water by a fountain coater and dehydration by an air knife were repeated three times, and then the obtained film was transported to a drying zone at 70° C. for 10 seconds and dried to manufacture a cellulose acylate film 2 which had been subjected to an alkali saponification treatment.

| Alkali solution | |
|---|---|
| Potassium hydroxide | 4.7 parts by mass |
| Water | 15.8 parts by mass |
| Isopropanol | 63.7 parts by mass |
| Surfactant SF-1 ($C_{14}H_{29}O(CH_2CH_2O)_{20}H$) | 1.0 part by mass |
| Propylene glycol | 14.8 parts by mass |

A coating liquid for forming an alignment film having the following composition was continuously applied onto the cellulose acylate film 2 which had been subjected to an alkali saponification treatment, with a #8 wire bar. The applied coating liquid for forming an alignment film was dried with hot air at 60° C. for 60 seconds and further dried with a hot air at 100° C. for 120 seconds to form an alignment film.

| Composition of coating liquid for forming alignment film | |
|---|---|
| Polyvinyl alcohol (manufactured by Kuraray Co., Ltd., PVA103) | 2.4 parts by mass |
| Isopropyl alcohol | 1.6 parts by mass |
| Methanol | 36 parts by mass |
| Water | 60 parts by mass |

The following coating liquid N for an optically anisotropic film was applied onto the cellulose acylate film 2 having the alignment film manufactured above. The applied coating liquid N for an optically anisotropic film was aged at 60° C. for 60 seconds and then irradiated with ultraviolet rays at 1,000 mJ/cm$^2$ using a 70-mW/cm$^2$ air-cooling metal halide lamp (manufactured by Eye Graphics Co., Ltd.) in air. Thus, the alignment state where the rod-like polymerizable liquid crystal compound was vertically aligned was fixed to manufacture a positive C-plate film 1. The thickness-direction retardation at a wavelength of 550 nm of the positive C-plate film 1 was −60 nm.

| Composition of coating liquid N for optically anisotropic film | |
|---|---|
| The following polymerizable liquid crystal compound L-1 | 80 parts by mass |
| The following polymerizable liquid crystal compound L-2 | 20 parts by mass |
| Vertical aligning agent (the following S01) | 1 part by mass |
| Vertical aligning agent (the following S02) | 0.5 parts by mass |
| Ethylene oxide-modified trimethylol propane triacrylate (V#360, manufactured by Osaka Organic Chemical Industry Ltd.) | 8 parts by mass |
| IRGACURE 907 (manufactured by BASF) | 3 parts by mass |
| KAYACURE DETX (manufactured by Nippon Kayaku Co., Ltd.) | 1 part. by mass |
| The following compound B03 | 0.4 parts by mass |
| Methyl ethyl ketone | 170 parts by mass |
| Cyclohexanone | 30 parts by mass |

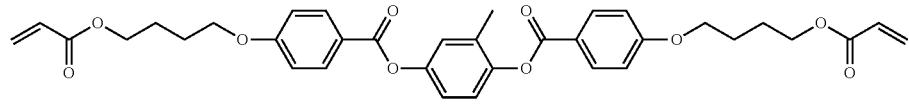

L-1

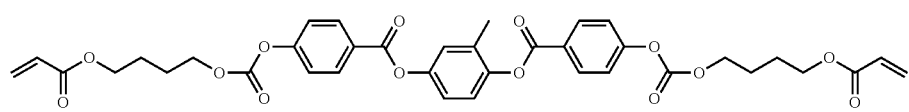

L-2

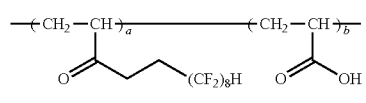

B03

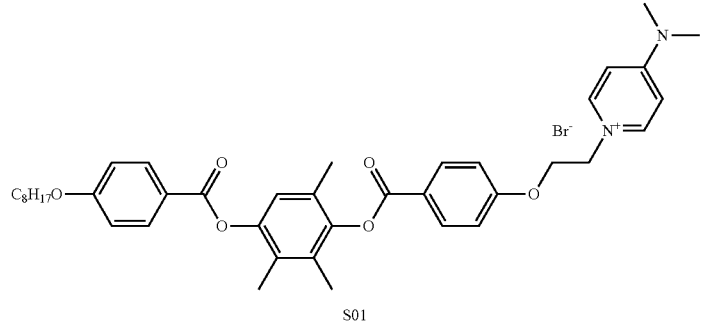

S01

| Composition of coating liquid N for optically anisotropic film |
|---|
| 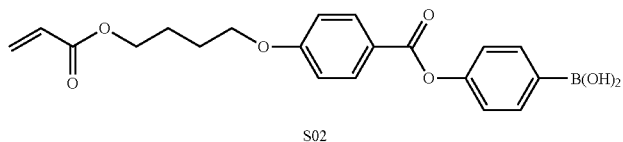 [SMILES: C=CC(=O)OCCCCOc1ccc(C(=O)Oc2ccc(B(O)O)cc2)cc1] |
| S02 |

(Manufacture of Circularly Polarizing Plate)

A surface of the optically anisotropic layer of the manufacture liquid crystal film was subjected to a corona treatment and further coated with an epoxy-based ultraviolet (UV) adhesive. The positive C-plate film 1 manufactured above was transferred thereto, the UV adhesive was cured with UV, and then the cellulose acylate film 2 was removed. Further, a polyvinyl alcohol (PVA) polarizing plate with a protective film was adhered onto the cellulose acylate film 1 side of the optical laminate through a pressure sensitive adhesive to obtain a circularly polarizing plate.

<Interfacial Peeling Force between UV Adhesive and Optical Laminate>

An area not coated with the UV adhesive (uncoated area) between the optical laminate and the positive C-plate film 1 of the manufactured circularly polarizing plate was prepared, and a 180° peeling force was measured (unit: N/25 mm) in accordance with JIS6854-2 with the prepared uncoated area as a grip portion. In a case where the force is 1.6 N/25 mm or more, the adhesion can be considered to be firm, and in a case where the force is 1.0 N/25 mm or more, there is no problem in practical use. The results are shown in Table 1.

In addition, with regard to examples using the liquid crystal compositions 6 and 7, the present test was omitted since the alignment of the obtained optically anisotropic layer was at a level less than desired performance.

In Table 1, the section of "Addition amount" indicates a content of the leveling agent with respect to the total content of the polymerizable liquid crystal compound in the liquid crystal composition.

The section of "UV adhesiveness" indicates a measurement result of a 180° peeling force (unit: N/25 mm) in the measurement test of an interfacial peeling force.

From the results of Examples, it was found that the optically anisotropic layer contained in the liquid crystal film of the embodiment of the present invention has excellent alignment and excellent adhesiveness.

From the results of Example 2, it was found that in a case where the fluoroaliphatic group-containing copolymer has a repeating unit having a crosslinking group, the adhesiveness is more excellent.

EXPLANATION OF REFERENCES

1A, 1B, 1C: liquid crystal film
2: optically anisotropic layer
3: support
4: alignment layer
5: intermediate layer
10A, 10B, 10C: optical laminate
11: adhesive layer
20: optically functional layer
40: polarizer
50: organic EL display element
100: organic EL display device

What is claimed is:

1. A liquid crystal film comprising:
an optically anisotropic layer formed with a liquid crystal composition including a polymerizable liquid crystal compound and a fluoroaliphatic group-containing copolymer; and
a support,
wherein the fluoroaliphatic group-containing copolymer has a repeating unit derived from a fluoroaliphatic group-containing monomer represented by General

TABLE 1

| | Optically anisotropic layer | | | | |
|---|---|---|---|---|---|
| | Liquid crystal composition | Leveling agent (fluoroaliphatic group-containing copolymer) | | Evaluation | |
| | | | | | UV adhesiveness |
| | Type | Type | Addition amount | Alignment | (N/25 mm) |
| Example 1 | 1 | FA-1 | 0.15% by mass | AAA | 3.1 |
| Example 2 | 2 | FA-2 | 0.15% by mass | AA | 4.2 |
| Example 3 | 3 | FA-1 | 0.10% by mass | AAA | 3.7 |
| Example 4 | 4 | FA-1 | 0.20% by mass | AA | 1.4 |
| Comparative Example 1 | 5 | FB-1 | 0.15% by mass | AAA | 0.1 |
| Comparative Example 2 | 6 | FC-1 | 0.15% by mass | D | — |
| Comparative Example 3 | 7 | FD-1 | 0.15% by mass | C | — |

Formula (1) and a repeating unit having a polymerizable group polymerizable with the polymerizable liquid crystal compound,

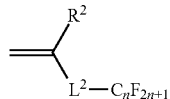
(1)

in General Formula (1), $R^2$ represents a hydrogen atom, a halogen atom, or an alkyl group, $L^2$ represents a divalent linking group, and n represents an integer of 1 to 6, wherein the polymerizable liquid crystal compound has a group selected from the group consisting of groups represented by General Formulae (A1) to (A5),

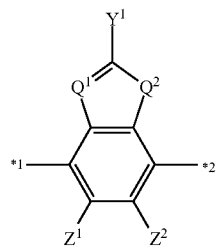
(A1)

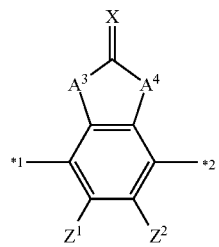
(A2)

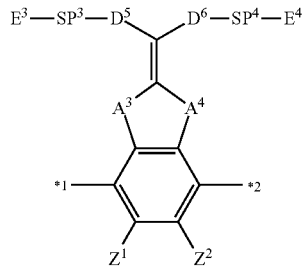
(A3)

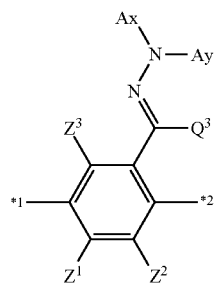
(A4)

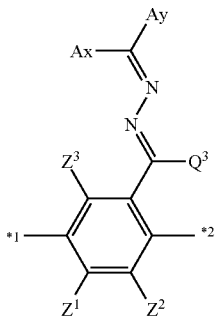
(A5)

in General Formulae (A1) to (A5), *1 and *2 each represent a bonding position, $Q^1$ represents N or CH, $Q^2$ represents —S—, —O—, or —N($J^5$)-, and $J^5$ represents a hydrogen atom or an alkyl group having 1 to 6 carbon atoms, $Y^1$ represents an aromatic hydrocarbon group having 6 to 12 carbon atoms or an aromatic heterocyclic group having 3 to 12 carbon atoms, each of which may have a substituent, $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a halogen atom, a cyano group, a nitro group, —N$J^6J^7$, or —S$J^8$, $J^6$ to $J^8$ each independently represent a hydrogen atom or an alkyl group having 1 to 6 carbon atoms, and $Z^1$ and $Z^2$ may be bonded to each other to form an aromatic ring, $A^3$ and $A^4$ each independently represent a group selected from the group consisting of —O—, —N($J^9$)-, —S—, and —CO—, and $J^9$ represents a hydrogen atom or a substituent, X represents a non-metal atom of Groups 14 to 16 to which a hydrogen atom or a substituent may be bonded, $D^5$ and $D^6$ each independently represent a single bond, —CO—O—, —C(=S)O—, —C$J^1J^2$-, -C$J^1J^2$-C$J^3J^4$-, —O-C$J^1J^2$-, —C$J^1J^2$-O-C$J^3J^4$-, —CO—O—C$J^1J^2$-, —O—CO—C$J^1J^2$-, —C$J^1J^2$-O—CO-C$J^3J^4$-, —C$J^1J^2$-CO—O-C$J^3J^4$-, —N$J^1$-C$J^2J^3$-, or —CO-N$J^1$-, and $J^1$, $J^2$, $J^3$, and $J^4$ each independently represent a hydrogen atom, a fluorine atom, or an alkyl group having 1 to 4 carbon atoms, $SP^3$ and $SP^4$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, and Q represents a substituent, $E^3$ and $E^4$ each independently represent a monovalent organic group, Ax represents an organic group having 2 to 30 carbon atoms, which has at least one aromatic ring selected from the group consisting of an aromatic hydrocarbon ring and an aromatic heterocyclic ring, Ay represents a hydrogen atom, an alkyl group having 1 to 6 carbon atoms, which may have a substituent, or an organic group having 2 to 30 carbon atoms, which has at least one aromatic ring selected from the group consisting of an aromatic hydrocarbon ring and an aromatic heterocyclic ring, the aromatic ring in each of Ax and Ay may have a substituent, and Ax and Ay may be bonded to each other to form a ring, and $Q^3$ represents a hydrogen atom, or an alkyl group having 1 to 6 carbon atoms, which may have a substituent.

2. The liquid crystal film according to claim 1,
wherein a content of the fluoroaliphatic group-containing copolymer in the liquid crystal composition is 0.01% to 0.20% by mass with respect to a total mass of the polymerizable liquid crystal compound.

3. The liquid crystal film according to claim 1,
wherein n represents an integer of 4 to 6.

4. The liquid crystal film according to claim 1,
wherein the polymerizable liquid crystal compound is a compound represented by General Formula (W),

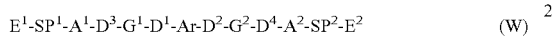
$$E^1\text{-}SP^1\text{-}A^1\text{-}D^3\text{-}G^1\text{-}D^1\text{-}Ar\text{-}D^2\text{-}G^2\text{-}D^4\text{-}A^2\text{-}SP^2\text{-}E^2 \quad (W)$$

in General Formula (W), Ar represents any one group selected from the group consisting of the groups represented by General Formulae (A1) to (A5), $D^1$, $D^2$, $D^3$, and $D^4$ each independently represent a single bond, —CO—O—, —C(=S)O—, —$CJ^1J^2$-, -$CJ^1J^2$-$CJ^3J^4$-, —O-$CJ^1J^2$-, -$CJ^1J^2$-O-$CJ^3J^4$-, —CO—O—$CJ^1J^2$-, —O—CO—$CJ^1J^2$-, -$CJ^1J^2$- O—CO—$CJ^3J^4$-, -$CJ^1J^2$-CO—O—$CJ^3J^4$-, -$NJ^1$-$CJ^2J^3$-, or —CO-$NJ^1$-, and $J^1$, $J^2$, $J^3$, and $J^4$ each independently represent a hydrogen atom, a fluorine atom, or an alkyl group having 1 to 4 carbon atoms, $G^1$ and $G^2$ each independently represent a divalent alicyclic hydrocarbon group having 5 to 8 carbon atoms, and one or more of —$CH_2$-'s constituting the alicyclic hydrocarbon group may be substituted with —O—, —S—, or —NH—, $A^1$ and $A^2$ each independently represent an aromatic ring group having 6 or more carbon atoms or a cycloalkylene ring group having 6 or more carbon atoms, $SP^1$ and $SP^2$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms may be substituted with —O—, —S—, —NH—, —N(Q)-, or —CO—, and Q represents a substituent, and $E^1$ and $E^2$ each independently represent a monovalent organic group, and at least one of $E^1$ or $E^2$ represents a polymerizable group, provided that in a case where Ar is the group represented by General Formula (A3), at least one of $E^1$ or $E^2$, or $E^3$ or $E^4$ in General Formula (A3) represents a polymerizable group.

5. The liquid crystal film according to claim 1,
wherein the fluoroaliphatic group-containing copolymer further has a repeating unit derived from a terminal cyclic hydrocarbon group-containing monomer.

6. The liquid crystal film according to claim 5,
wherein the terminal cyclic hydrocarbon group-containing monomer is a compound represented by General Formula (2),

in General Formula (2), $R^1$ represents a hydrogen atom, a halogen atom, or an alkyl group, $L^1$ represents a divalent linking group having an alkylene group having 2 or more carbon atoms, which may have a substituent, and Y represents an aromatic ring group which may have a substituent.

7. The liquid crystal film according to claim 1, further comprising:
a photo-alignment layer between the support and the optically anisotropic layer.

8. The liquid crystal film according to claim 1,
in which the support is provided to be peelable.

9. The liquid crystal film according to claim 2,
wherein n represents an integer of 4 to 6.

10. The liquid crystal film according to claim 2,
wherein the fluoroaliphatic group-containing copolymer further has a repeating unit derived from a terminal cyclic hydrocarbon group-containing monomer.

11. The liquid crystal film according to claim 10,
wherein the terminal cyclic hydrocarbon group-containing monomer is a compound represented by General Formula (2),

in General Formula (2), $R^1$ represents a hydrogen atom, a halogen atom, or an alkyl group, $L^1$ represents a divalent linking group having an alkylene group having 2 or more carbon atoms, which may have a substituent, and Y represents an aromatic ring group which may have a substituent.

* * * * *